(12) United States Patent
Eisenstadt et al.

(10) Patent No.: US 7,952,408 B2
(45) Date of Patent: May 31, 2011

(54) EMBEDDED PHASE NOISE MEASUREMENT SYSTEM

(75) Inventors: William Richard Eisenstadt, Gainesville, FL (US); Jae Shin Kim, Tempe, AZ (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 57 days.

(21) Appl. No.: 12/492,893

(22) Filed: Jun. 26, 2009

(65) Prior Publication Data

US 2010/0327940 A1 Dec. 30, 2010

(51) Int. Cl.
*H03H 11/16* (2006.01)

(52) U.S. Cl. .................................. 327/231; 327/244

(58) Field of Classification Search ................ None
See application file for complete search history.

(56) References Cited

OTHER PUBLICATIONS

Silva-Martinez, et al., "A 10.7-MHz 68-dB SNR CMOS Continuous-Time Filter with On-Chip Automatic Tuning," *IEEE Journal of Solid-State Circuits*, pp. 1843-1853, vol. 27, No. 12, Dec. 1992.
Vadipour, M., "Capacitive Feedback Technique for Wide-Band Amplifiers," *IEEE Journal of Solid-State Circuits*, pp. 90-93, vol. 28, No. 1, Jan. 1993.
Vasilopoulos, et al., "A Low-Power Wideband Reconfigurable Integrated Active-RC Filter with 73 dB SFDR," *IEEE Journal of Solid-State Circuits*, pp. 1997-2008, vol. 41, No. 9, Sep. 2006.
Circa, R., Pienkowski, D., and Boeck, G.;, "Integrated 130 nm CMOS Passive Mixer for 5 GHz WLAN Applications," *Microwave and Optoelectronics, 2005 SBMO/IEEE MTT-S International Conference*, pp. 103-106, Jul. 25-28, 2005.
Crols, J. and Steyaert, M., "A 1.5 GHz Highly Linear CMOS Downconversion Mixer," *IEEE Journal of Solid-State Circuits*, vol. 30, No. 7, pp. 736-742, Jul. 1995.
Devlin, L.M., et al. "A 2.4 GHz single chip transceiver," *IEEE Proceedings of Microwave and Millimeter Wave Monolithic Circuits Symposium*, pp. 23-26, Jun. 1993.
Do, M.A., et al., "Design of a phase splitter for $3^{rd}$ ISM band," *Electron Devices and Solid-State Circuits, 2003 IEEE Conference on*, vol., No., pp. 237-240, Dec. 16-18, 2003.
Goldfarb, M., et al., "A Novel MMIC Biphase Modulator with Variable Gain Using Enhancement-Mode FETs Suitable for 3V Wireless Applications," *IEEE Proceedings of Microwave and Millimeter Wave Monolithic Circuits Symposium*, pp. 99-102, San Diego, CA, 1994.
Kanazawa, K., et al., "A GaAs Double-Balanced Dual-Gate FET Mixer IC for UHF Receiver Front-End Applications," *Microwave Theory and Techniques, IEEE Transactions on*, vol. 33, No. 12, pp. 1548-1554, Dec. 1985.
Khalil, W., et al., "A Self-Calibrated On-Chip Phase-Noise Measurement Circuit With -75dBc Single-Tone Sensitivity at 100 kHz Offset," *IEEE Journal of Solid-State Circuits*, vol. 42, No. 12, pp. 2758-2765, Dec. 2007.

(Continued)

*Primary Examiner* — Cassandra Cox
(74) *Attorney, Agent, or Firm* — Saliwanchik, Lloyd, and Eisenschenk

(57) ABSTRACT

Phase noise detection systems for a device under test (DUT) are provided that can be embedded within a chip. According to one embodiment, the embedded phase noise detection system can include an active delay line cell, a phase shifter, and a phase detector. The active delay line and phase shifter separately receive the output signal of the DUT. The phase detector can include a double-balanced mixer followed by an active RC filter. The double-balanced mixer receives, as input, the outputs from the active delay line and phase shifter and can produce different dc voltages proportional to the difference from the input phase quadrature. An auto-adjustment circuit can also be included to help the input signal from the phase shifter to the mixer maintain quadrature.

17 Claims, 24 Drawing Sheets

OTHER PUBLICATIONS

Lee, T.H., and Hajimiri, A. "Oscillator Phase Noise: A Tutorial," *Solid-State Circuits, IEEE Journal of*, vol. 35, No. 3, pp. 326-336, Mar. 2000.

Lee, T.H., and Bulzachelli, J.F., "A 155-MHz Clock Recovery Delay and Phase Locked Loop," *IEEE Journal of Solid-State Circuits*, vol. 27, No. 12, pp. 1736-1746, Dec. 1992.

Ma, H. et al., "Novel Active Differential Phase Splitters in RFIC for wireless applications," *IEEE Trans. Microwave Theory Tech.*, vol. 46, No. 12, pp. 5897-2603, Dec. 1998.

Maneatis, J.G. and Horowitz, M.A., "Precise delay generation using coupled oscillators," *IEEE Journal of Solid-State Circuits*, vol. 28, No. 12, pp. 1273-1282, Dec. 1993.

Maneatis, J.G., "Low-Jitter Process-Independent DLL and PLL Based on Self-Biased Techniques," *IEEE Journal of Solid-State Circuits*, vol. 31, No. 11, pp. 1723-1732, Nov. 1996.

Silva-Martinez, et al. "A 60-mW 200-MHz Continuous-Time Seventh Order Linear Phase Filter with On-Chip Automatic Tuning System," *IEEE Journal of Solid-State Circuits*, vol. 38, No. 2, pp. 216-225, Feb. 2003.

$$2\pi\tau_d K_\phi [dB] = K_d [dB]$$
$$= P_{cal} - (\Delta S_{cal} + 20 \log f_{mcal} + 3) [dB]$$

$$\mathcal{L}(f_m) [dBc/Hz]$$
$$= S_V(f_m) - K_d - 20 \log f_m - 10 \log B - 3dB$$

EMBEDDED PHASE NOISE MEASUREMENT SYSTEM

The subject invention was made with government support under Contract No. HR001-07-3-0002 awarded by DARPA. The government has certain rights in this invention.

BACKGROUND OF THE INVENTION

Frequency sources, often generated through oscillators, include noise that appears as a superposition of causally generated signals (deterministic) and random (nondeterministic) noise. The noise creates time-dependent phase and amplitude fluctuations in the frequency source. Measurements of these fluctuations characterize the frequency source in terms of amplitude modulation (AM) and phase modulation (PM) noise.

Frequency stability can be defined as the degree to which an oscillating source produces the same frequency throughout a specified period of time. A signal wave shape having a perfect sine function is considered to have the highest frequency stability. A given frequency stability will decrease as the signal wave holds anything different than the perfect sine function. For example, RF and microwave sources exhibit some amount of frequency instability.

The frequency stability can be divided into long-term stability and short-term stability. Long-term stability describes the frequency variations that occur over long time periods expressed in parts per million per hour, day, month or year. Short-term frequency stability contains all the elements causing frequency changes about the nominal frequency within less than a few seconds duration.

Phase noise is the term most widely used to describe the characteristic randomness of frequency stability. The spectral purity refers to the ratio of signal power to phase-noise sideband power.

Measurements of phase noise and AM noise may be performed in the frequency domain using a spectrum analyzer that provides a frequency window following a detector (double balanced mixer). Frequency stability can also be measured in the time domain with a gated counter that provides a time window following the detector.

There are two kinds of fluctuating phase terms for phase instability that may be used to characterize a real signal. They are deterministic and random. The deterministic terms are discrete signals appearing as distinct components in the spectral density plot. These discrete signals, often referred to as spurious, can be related to known phenomena in the signal source such as power line frequencies, vibration frequencies, and mixer products. The random kind of phase instability is commonly considered as phase noise. Thermal noise, shot noise, and noise of undetermined origin (such as flicker noise) are considered to be types of random noise. The source of random sideband noise in an oscillator includes these types of random noise.

Many terms exist to quantify the characteristic randomness of phase noise. The frequency or phase deviations of the source under test are usually measured in either the frequency or time domain. Since frequency and phase are related to each other, the terms that characterize phase noise are also related.

One fundamental description of phase instability (phase noise) is the spectral density of phase fluctuations on a per-Hertz basis. The spectral density defines the energy distribution as a continuous function, expressed in units of phase variance per unit bandwidth. Thus, the spectral density $S_\phi(f_m)$ may be considered as equation (1)

$$S_\phi(f_m) = \frac{\Delta\phi_{rms}^2(f_m)}{BW \text{ used to measure } \Delta\phi_{rms}} \frac{\text{rad}^2}{\text{Hz}} \quad (1)$$

where BW (bandwidth) is negligible with respect to any changes in $S_\phi$ versus the Fourier frequency (or offset frequency) $f_m$.

One useful measurement of noise energy is $L(f_m)$ which can be directly related to the spectral density $S_\phi(f_m)$ by a simple approximation as shown in equation (2), which has generally negligible error if the modulation sidebands are such that the total phase deviations are much less than 1 radian.

$$L(f_m) = \frac{S_\phi(f_m)}{2} \quad (2)$$

$L(f_m)$ is an indirect measurement of noise energy related to the RF power spectrum that can be observed on a spectrum analyzer. The U.S. National Bureau of Standards defines $L(f_m)$ as the ratio of the power in one phase modulation sideband to the total signal power (at an offset of $f_m$ Hertz away from the carrier). This relationship is shown by equation (3) below:

$$L(f_m) = \frac{P_{ssb}}{P_s} \quad (3)$$

$$= \frac{\left(\begin{array}{c}\text{power density}\\\text{in one phase}\\\text{modulation sideband}\end{array}\right)}{\text{total signal power}}$$

$$= \begin{array}{c}\text{single sideband}(SSB)\text{ phase}\\\text{noise to carrier ratio per Hz}\end{array}$$

Here, the phase modulation sideband is based on per Hertz of bandwidth spectral density and $f_m$ is the Fourier frequency or offset frequency.

The spectral density of frequency fluctuations ($S_{\Delta f}(f_m)$) is also used for quantifying short term frequency instability (phase noise). The spectral density defines the energy distribution as a continuous function, expressed in units of frequency variance per unit bandwidth and can be expressed as shown in equation (4).

$$S_{\Delta f}(f_m) = \frac{\Delta f_{rms}^2(f_m)}{BW \text{ used to measure } \Delta f_{rms}} \frac{\text{Hz}^2}{\text{Hz}} \quad (4)$$

where BW is negligible with respect to any changes in $S_\phi$ versus $f_m$.

A logarithmic plot of the spectral density of the phase modulation sideband is typically used for phase noise in the phase-frequency domain because of the large magnitude variations of the phase noise on an oscillator. These plots are typically expressed in dB relative to the carrier per Hz (dBc/Hz).

The spectral density $S_\phi(f_m)$, the noise energy ratio $L(f_m)$, and the spectral density of the frequency fluctuations $S_{\Delta f}(f_m)$ are related, and their relationships can be described using logarithmic terms as shown in equation (5) and equation (6) below.

$$S_\phi(f_m)\left[\frac{\text{dBr}}{\text{Hz}}\right] = S_{\Delta f}(f_m)\left[\frac{\text{dBHz}}{\text{Hz}}\right] - 20\log\frac{f_m(\text{Hz})}{1(\text{Hz})} \quad (5)$$

$$L(f_m)\left[\frac{\text{dBc}}{\text{Hz}}\right] = S_{\Delta f}(f_m)\left[\frac{\text{dBHz}}{\text{Hz}}\right] - 20\log\frac{f_m(\text{Hz})}{1(\text{Hz})} - 3 \text{ dB} \quad (6)$$

where dBHz/Hz is dB relative to one Hz per Hz bandwidth, dBr/Hz is dB relative to one radian per Hz bandwidth, and dBc/Hz is dB relative to a carrier per Hz bandwidth.

The basic idea of an oscillator is to convert dc power to a periodic, sinusoidal RF output signal. Though all oscillators ultimately need a nonlinear description of their behavior, a linear approach is sufficient for their analysis and design. FIG. 1 illustrates a block diagram of an oscillator. The oscillator includes an amplifier with a frequency dependent gain $G(j\omega)$ and a frequency dependent feedback network $H(j\omega)$. The feedback network includes a resonator circuit with a quality factor Q. The resonating circuit has losses due to the finite quality factor and can be modeled as a parallel RLC resonance circuit as shown in FIG. 2. This circuit is also called a tank circuit in the literature.

The inductor L and the capacitor C determine the resonance frequency and the resistor R represents the losses in the circuit. The resistor R determines the Q of the resonator. The impedance of the circuit looking at the input port can be described using equation (7).

$$Z_{in} = \left(\frac{1}{R} + \frac{1}{j\omega L} + j\omega C\right)^{-1} \quad (7)$$

The resonance frequency can be established when the imaginary part of equation (7) is equal to zero. This means that the maximum amount of energy is oscillating between the inductor and capacitor. The oscillation frequency is shown below as equation (8).

$$\frac{1}{\omega_c C} = \omega_c L \quad (8)$$

and the resonance frequency can be described as shown in equation (9).

$$\omega_c = \frac{1}{\sqrt{LC}} \quad (9)$$

The Q is defined as the bandwidth BW of the resonance graph (see FIG. 3). The Q for a resonator with losses described by the resistance R can be modeled as shown in equation (10).

$$Q = \frac{R}{\omega_c L} = \omega_c CR \quad (10)$$

The transfer function for a conventional oscillator block can be derived as equation (11):

$$\frac{V_o}{V_{in}} = \frac{G(j\omega)}{1 + G(j\omega)H(j\omega)} \quad (11)$$

For an oscillator, $V_o$ is nonzero when $V_{in}$ is equal to zero, the oscillation condition can be extracted as shown in equation (12) and equation (13).

$$|G(j\omega_c)H(j\omega_c)| = 1 \quad (12)$$

$$\arg[G(j\omega_c)H(j\omega_c)] = 180° \quad (13)$$

These magnitude and phase conditions have to be fulfilled at one frequency to get stable oscillation at the output of the oscillator.

Dating back to 1966, D. B. Leeson published a model for describing the output noise behavior of a feedback oscillator (see D. B. Leeson in "A simple model of feedback oscillator noise spectrum," *IEEE Proceedings*, Vol. 54, February 1966). This model is still widely used for estimating the output spectral density of the phase noise of an oscillator. Referring again to FIG. 2, by assuming that the output is the voltage across the tank circuit, the only source of noise is the white thermal noise of the tank conductance. This noise can be represented as a current source across the parallel resonance circuit with a mean-square spectral density of equation (14).

$$\frac{\overline{i_n^2}}{\Delta f} = \frac{4kT}{R} \quad (14)$$

The current noise obtained through equation (14) becomes voltage noise when multiplied by the effective impedance looking into the current source. By considering that the energy restoration element must contribute an average effective negative resistance that precisely cancels the positive resistance of the parallel resonance circuit, the effective impedance looking into the noise current source is the same as the impedance of a perfectly lossless LC network. But at resonance, this is zero. For a relatively small offset frequency $\Delta\omega$ from the center frequency $\omega_c$, the impedance of an LC resonance circuit is approximately described by equation (15).

$$Z(\omega_c + \Delta\omega) \approx -j\frac{\omega_c L}{2\Delta\omega/\omega_c} \quad (15)$$

By using the definition of quality factor Q as described with respect to equation (10), the impedance of an LC resonance circuit yields equation (16).

$$|Z(\omega_c + \Delta\omega)| \approx -R\frac{\omega_c}{2Q\Delta\omega} \quad (16)$$

Then, the spectral density of the mean-square noise voltage can be obtained by multiplying the spectral density of the mean-square noise current with the squared magnitude of the impedance of an LC resonance circuit as shown in equation (17).

$$\frac{\overline{v_n^2}}{\Delta f} = \frac{\overline{i_n^2}}{\Delta f}|Z|^2 = 4kTR\left(\frac{\omega_c}{2Q\Delta\omega}\right)^2 \quad (17)$$

The power spectral density of the output noise is frequency-dependent. This $1/f^2$ behavior represents two characteristics. The first is that the voltage frequency response of an LC resonance circuit rolls off as $1/f$ to either side of the center frequency. The second is that the power is proportional to the square of voltage. An increase of an LC resonance circuit's Q reduces the noise density with all other parameters constant.

Thermal noise causes fluctuations in both amplitude and phase as shown through equation (17) above. Noise energy would split equally into amplitude and phase noise if not for the amplitude limiting that occurs in real circuits. The amplitude limiting mechanisms present in all practical oscillators result in attenuated amplitude noise. In order to quantify this noise level, it is conventional to normalize the mean-square noise voltage density to the mean-square carrier voltage in decibels. This normalization expresses the following phase noise equation (18).

$$L(f_m)\left[\frac{dBc}{Hz}\right] = 10\log\frac{P_{noise}}{P_{carrier}} \text{ per Hz} \quad (18)$$

$$= 10\log\left[\frac{2kT}{P_{carrier}}\left(\frac{\omega_c}{2Q\Delta\omega}\right)^2\right]$$

However, equation (18) requires many simplifying assumptions. Therefore, there are some significant differences between the spectrum obtained by equation (18) and the real oscillator spectrum. To solve this discrepancy, Leeson provided a modification to equation (18) as shown in equation (19).

$$L(f_m)\left[\frac{dBc}{Hz}\right] = 10\log\left[\frac{2FkT}{P_{carrier}}\left(1 + \frac{\omega_c}{2Q\Delta\omega}\right)^2\left(1 + \frac{\Delta\omega_{1/f^3}}{|\Delta\omega|}\right)\right] \quad (19)$$

These modifications consist of a factor F to account for the increased noise in the $1/(f_m)^2$ region, an additive factor of unity to account for the noise floor, and a multiplicative factor to provide a $1/|f_m|^3$ behavior at sufficiently small offset frequency. Although Leeson's model is useful for obtaining intuitive insight, the factor F is an empirical Fitting parameter and must be determined from measurement, diminishing the predictive power of the phase noise equation. Also, the 1/f corner of device noise is not precisely equal to $(f_m)_{1/f^3}$ in practice.

There are many methods for measuring phase noise. Three common methods are direct measurement, PLL-based measurement (two oscillator method), and FM discriminator (delay-line based) measurement (one oscillator method).

The most simple and straightforward method of phase noise measurement is direct measurement. That is, to input the test signal into a spectrum analyzer arid directly measure the power spectral density of the oscillator. However, this method may be significantly limited by the spectrum analyzer's dynamic range, resolution, and LO (local oscillator) phase noise. Though this direct measurement is not useful for measurements close in to a drifting carrier, it is convenient for qualitative quick evaluation on sources with relatively high noise. The measurement is valid if the following conditions are met. The first is that the spectrum analyzer SSB phase noise at the offset of interest must be lower than the noise of the Device-Under-Test (DUT). The second condition is that since the spectrum analyzer will measure total noise power, the amplitude noise of the DUT must be significantly below its phase noise (Typically 10 dB will suffice).

FIG. 4 shows a typical display of an oscillator mixed down to DC. The main advantage of this method is its simple test set-up and that it can measure phase noise at high offset frequencies from the carrier. However, there are several disadvantages. One is that the spectrum analyzer cannot distinguish a difference between amplitude noise and phase noise and one does not have any idea regarding the noise power in the amplitude and phase of a DUT. Finally, some correction factors have to be incorporated in order to compensate the phase noise power since the phase noise power is normalized to a bandwidth of 1 Hz in an ideal rectangular filter but the resolution bandwidth filter of the spectrum analyzer is non-ideal.

The Phase Locked Loop (PLL)-based method is one of the most sensitive methods for measuring phase noise. Two oscillators send signals to the two RF ports of a mixer. The IF signal of a mixer passes through a low pass filter to keep out the sum frequency components and then sends them back in a small bandwidth's signal to lock one oscillator to the other. The fundamental block diagram is shown in FIG. 5. The basis of this method is the double-balanced mixer used as a phase detector.

Two signals at identical frequencies and nominally in phase quadrature (i.e. 90° out of phase) are input to the phase detector (a double balanced mixer). At quadrature, the output of the phase detector is a difference frequency of 0 Hz and an average voltage output of 0 V. There is a small fluctuation voltage, $\Delta V$. For small phase deviations ($\Delta\phi \ll 1$ rad), this fluctuating voltage is proportional to the fluctuating phase difference between the two signals. This phase difference represents the combined phase modulation sidebands of the two input signals. When the two input signals are identical in frequency and in phase quadrature, the output of the phase detector is a voltage directly proportional to the combined phase modulation sidebands of the two input signals.

The frequency and amplitude offsets are then removed such that the two input signals are again at identical frequencies, and are set in phase quadrature. It is important to use the mixer in its linear region where the voltage output is directly proportional to the phase difference of the input signals by a constant A (i.e. the mixer's efficiency).

FIG. 6 shows a typical mixer-phase detector characteristic. The mixer produces an output voltage V(t) proportional to the fluctuating phase difference between the two input signals $\phi_{LO}-\phi_{RF}$. The point of maximum phase sensitivity and the center of the region of most linear operation occur where the phase difference between the two inputs is equals to 90° or phase quadrature.

In this measurement method, the phase quadrature is the point of maximum phase sensitivity and the region of most linear operation. Any small deviation from quadrature results in a measurement error. Table 1 shows the typical error table of PLL based phase noise measurement system (Agilent 11729B phase noise measurement system).

TABLE 1

| Error contribution to the measurement | |
|---|---|
| Offset from quadrature | Measurement Error |
| 1° | −0.001 dB |
| 3° | −0.01 dB |
| 10° | −0.13 dB |

The PLL-based method has several advantages and disadvantages. The PLL-based method uses a smaller spectrum analyzer dynamic range after converting the RF signal to the baseband signal. The internal noise of the spectrum analyzer is not the limiting factor. A low noise preamplifier is used to amplify the baseband signal to meet the range of the spectrum analyzer. In addition, the mixer operating as a phase detector is suppressing the amplitude noise due to its quadrature input condition in this setup. Currently, good mixers achieve an AM noise suppression from 30~40 dB. For the PLL-based method, the measurement result is 3 dB higher for the case of two identical sources because the DUT and the reference have the same characteristic. The reference source is a high stable oscillator, which is the limiting factor of the test setup. A disadvantage for the PLL-based method is the need for two sources in this test setup.

Delay line discriminators are only capable of measuring phase based random noise, and are in fact insensitive to AM noise. This can be an important advantage when measuring the phase noise of sources which do have significant AM noise. Accordingly, it can be important to first identify the two types of noise present in a frequency source: AM noise and phase noise. Phase noise, generally considered to be the dominant form of random noise, is defined as the noise generated from random fluctuations in the phase of a frequency source. AM noise is simply the noise generated from random fluctuations in the amplitude of a frequency source.

Unlike the PLL based method, a frequency discriminator method (delay line method) does not require a second reference signal phased locked to a DUT. This makes the frequency discriminator method extremely useful for measuring DUTs that are difficult to phase kick. It can also be used to characterize sources with high-level, low-rate phase noise, or high close-in spurious sidebands, which can impose serious problems for the PLL-based method.

The delay line implementation of the frequency discriminator converts short-term frequency fluctuations ($\Delta f$) of DUT into voltage fluctuations ($\Delta V$) that can be measured using a baseband analyzer. The conversion is two part process, first converting the frequency fluctuations into phase fluctuations and then converting the phase fluctuations to voltage fluctuations as shown in FIG. 7.

The frequency fluctuation to phase fluctuation transformation ($\Delta f \rightarrow \Delta \phi$) takes place in the delay line. The nominal frequency arrives at the double-balanced mixer at a particular phase. As the frequency changes slightly, the phase shift incurred in the fixed delay time will change proportionally. The delay line converts the frequency change at the line input to a phase change at the line output when compared to the non-delayed signal arriving at the mixer in the second path. The double-balanced mixer transforms the instantaneous phase fluctuations into voltage fluctuations ($\Delta \phi \rightarrow \Delta V$). With the two input signals 90° out of phase, the voltage output is proportional to the input phase fluctuations. The power spectral density of the phase noise measured by this system can be described by equation (20).

$$L(f_m) = \frac{V_{out,rms}^2(f_m)}{2(K_\phi 2\pi f_m \tau_d)^2} \text{ (in 1 Hz measurement bandwidth)} \quad (20)$$

where $K_\phi$ is a constant related to the output voltage of the signals passing through the delay line and the phase shifter.

As shown in equation (20), the system sensitivity is closely related to delay time $\tau_d$. As the delay time increases, the sensitivity is better. In order to get a proper sensitivity, the delay line should be long enough since the delay time is inversely proportional to the phase noise.

Accordingly, means and methods for phase noise measurement continue to require additional research and improvement. In addition, there exists a need in the art for a measurement system that can be incorporated on-chip.

BRIEF SUMMARY

Embodiments of the present invention provide systems and methods for phase noise measurement. In addition, an embodiment of the present invention provides an active RC filter having a compensation method for improved characteristics at particular frequencies. The subject active RC filter can be incorporated in a double balanced mixer for a variety of applications including phase noise measurement applications.

In accordance with an embodiment, the subject systems and methods can be implemented for Built-in Self-Test (BIST) and embedded test applications. One embodiment of the present invention provides CMOS-based circuitry that extracts phase noise of a device under test (DUT).

In an embodiment, an embedded phase noise measurement system is provided including: an analog delay line created by cascaded active amplifier stages; an analog phase shifter, and a double balanced mixer receiving the output of the analog delay line and analog phase shifter. The subject circuit can be incorporated in a test probe or built on-circuit near a DUT. The subject circuit can be used for a stand-alone test chip or for one component of the whole system. In a specific embodiment, the subject circuit can be used to test voltage controlled oscillators (VCOs).

Embodiments of the present invention are applicable to wireless or wired circuits, general RF measurement equipment and products related to built-in self-test (BIST) and embedded test applications.

BRIEF DESCRIPTION OF THE DRAWINGS

FIG. 9A shows an input power spectrum; FIGS. 9B and 9C show delay line and phase shifter output; FIGS. 9D and 9E show the system noise output; and FIG. 9F shows the phase noise result.

FIG. 10A shows a calibration test set-up and FIG. 10B shows calibration equations and calibration results.

FIG. 31A is a plot of a small output test signal (FM dev=2 Hz, FM rate=1 MHz); and FIG. 31B is a plot of system sensitivity.

FIG. 33A shows an input test signal; and FIG. 33B shows the system output.

DETAILED DISCLOSURE

Embodiments of the present invention provide a modified delay-line based phase noise measurement system and method. Embodiments can be implemented as an embedded phase noise measurement system on-chip. For example, embodiments of the subject embedded phase noise measurement system can be implemented on standard CMOS.

In accordance with an embodiment of the present invention, an active analog delay line can be used to provide the delay line structure, and an active phase shifter can be used to provide amplification within a frequency discriminator system of the present invention. The active analog delay line can incorporate cascaded differential inverting amplifiers. The active phase shifter can incorporate a variable delay line structure based on a similar differential inverting amplifier as is used for the active analog delay line.

Figure 1:
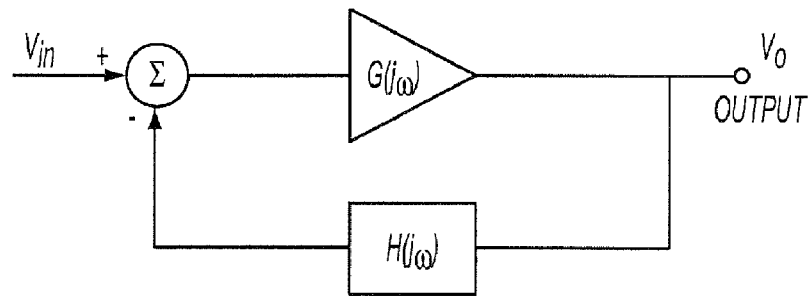
FIG. 1 shows a block diagram of an oscillator.
Figure 2:
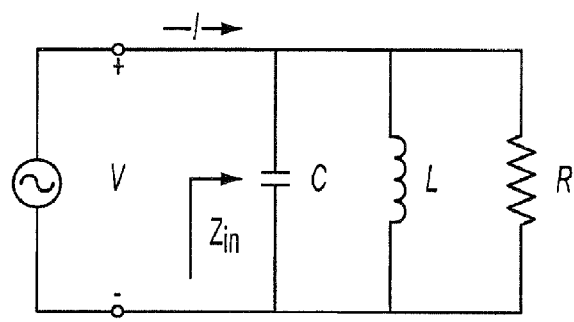
FIG. 2 shows a schematic diagram of a parallel resonance circuit that can be used to model the frequency dependent feedback network of the oscillator shown in FIG. 1.
Figure 3:
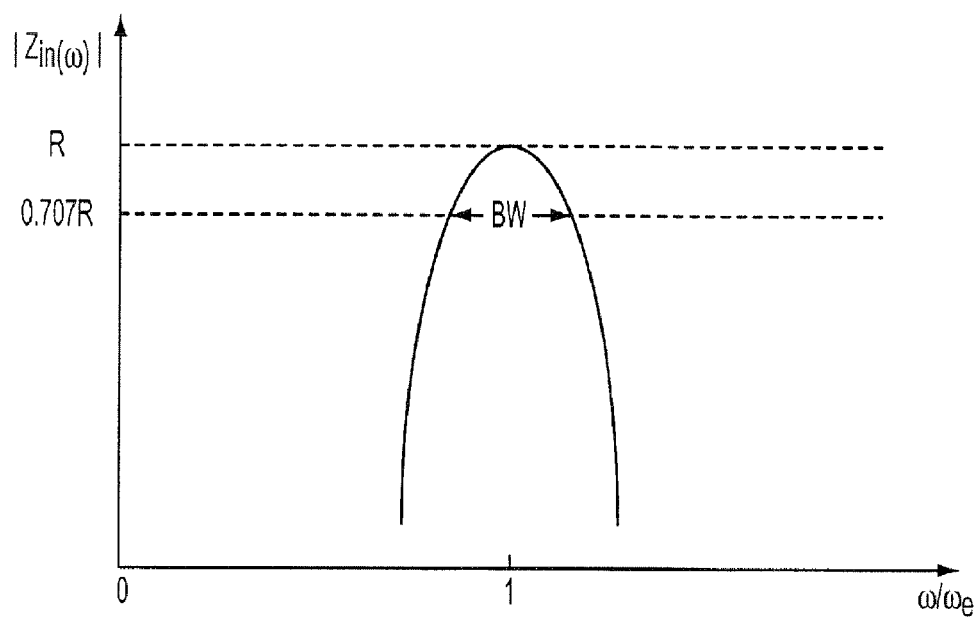
FIG. 3 shows a plot of the normalized bandwidth of a resonator.
Figure 4:
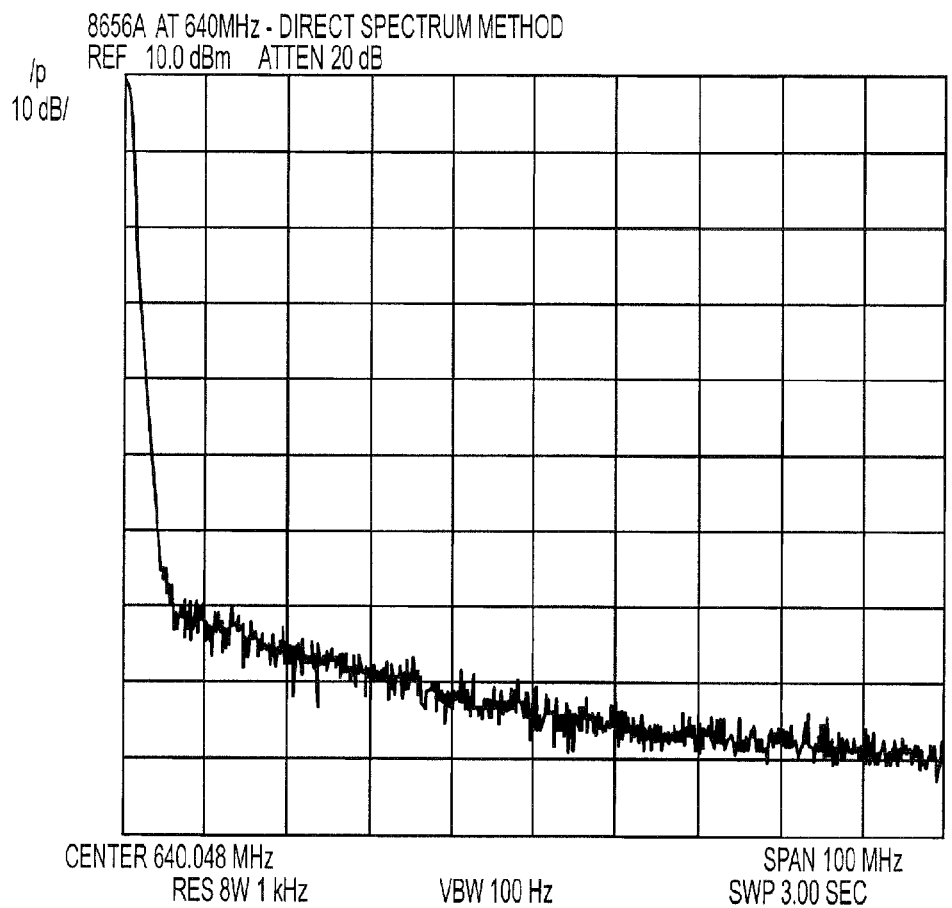
FIG. 4 shows a screen capture shot of SSB phase noise measured using the direct measurement method.
Figure 5:
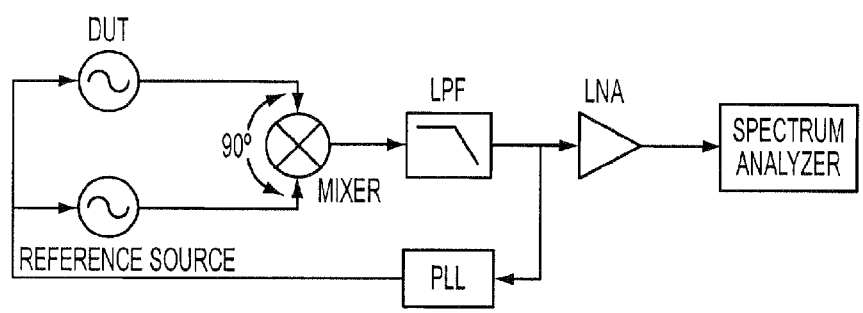
FIG. 5 shows a schematic diagram of a PLL-based phase noise measurement system.
Figure 6:
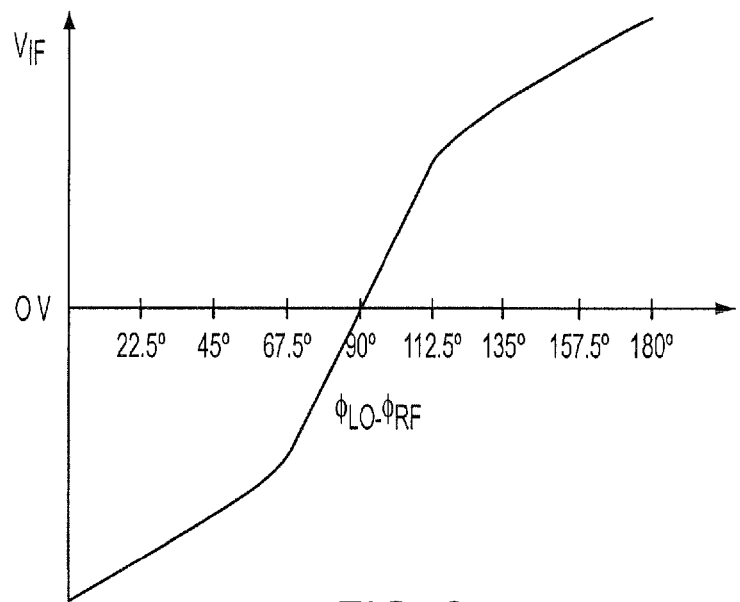
FIG. 6 shows a plot of a conventional double-balanced mixer characteristic.
Figure 7:
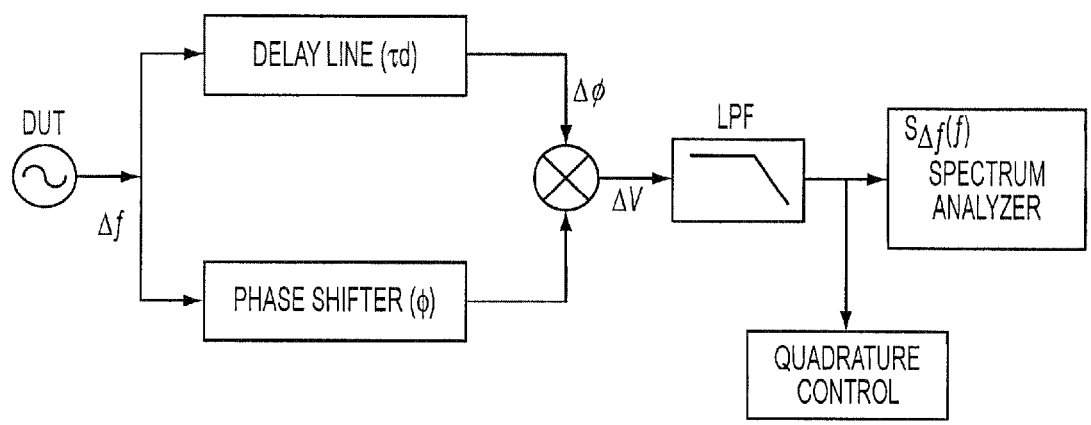
FIG. 7 shows a schematic diagram for a basic delay line frequency discriminator method.
Figure 8:
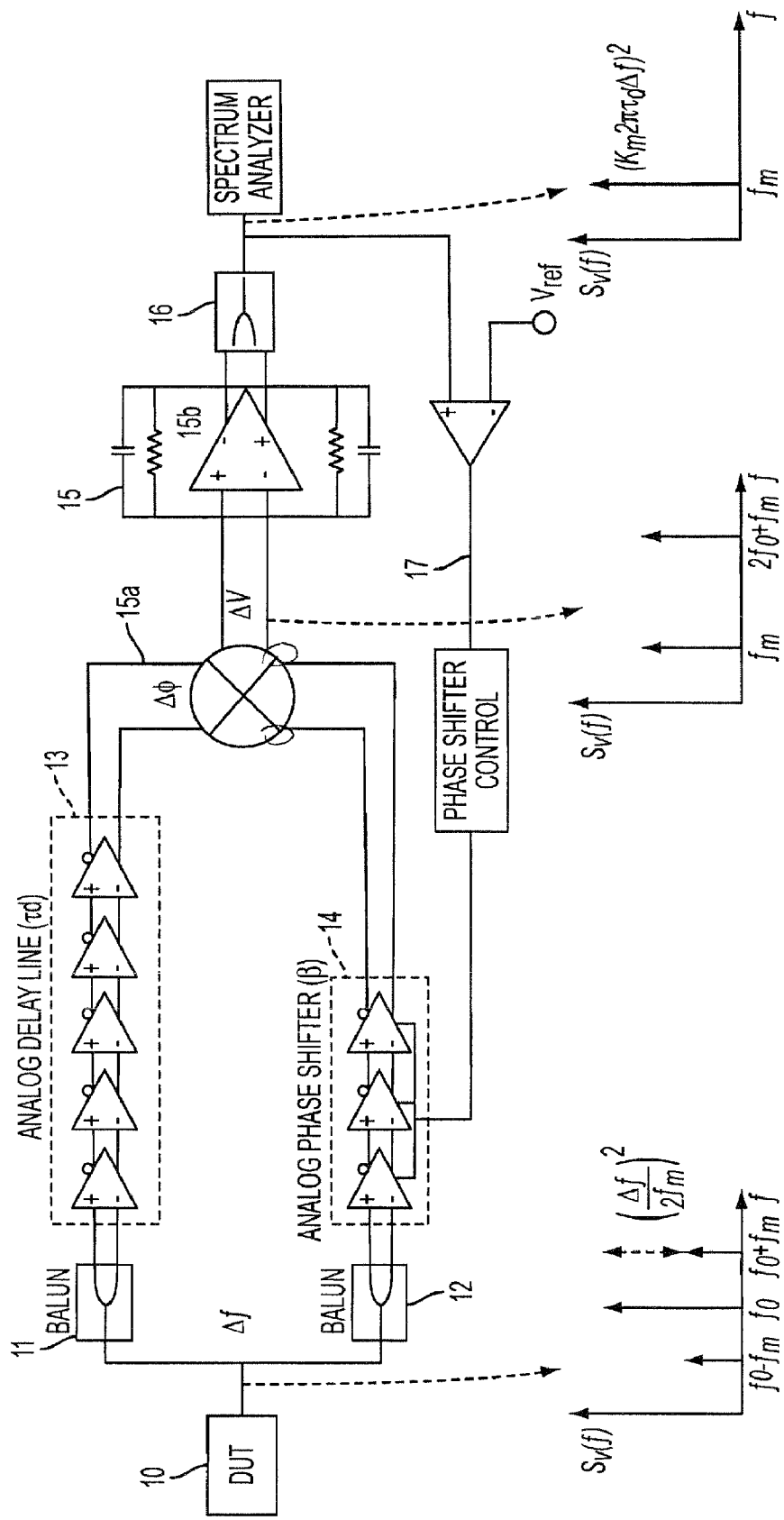
FIG. 8 shows a schematic block diagram of an embedded phase noise measurement system in accordance with an embodiment of the present invention.

FIG. 8 shows a schematic diagram of an embedded phase noise measurement system in accordance with an embodiment of the present invention. The subject system can include a first balun 11 and a second balun 12 connected to a DUT 10, an active delay line 13 receiving the differential signal from the first balun 11, an active phase shifter 14 receiving the differential signal from the second balun 12, and a double balanced mixer 15. The double balanced mixer works like an analog multiplier to function as a phase detector. The output of the double balanced mixer 15 can be output through a third balun 16. A phase shifter auto-adjustment 17 can be further included to help maintain quadrature for the double balanced mixer by comparing the output with a reference ($V_{ref}$) and controlling the phase shifter 14. The output signal from the third balun 16 can be observed and/or analyzed using known test equipment, such as a spectrum analyzer.

The subject system can be incorporated in a test probe or built on-circuit near a DUT. The system can be used for a stand-alone test chip or for one component of the whole system. In a specific embodiment, the subject system can be used to test voltage controlled oscillators (VCOs). By being positioned at or near the VCO on-chip, minimal loading occurs and the testing can be minimally invasive.

Figure 9A:
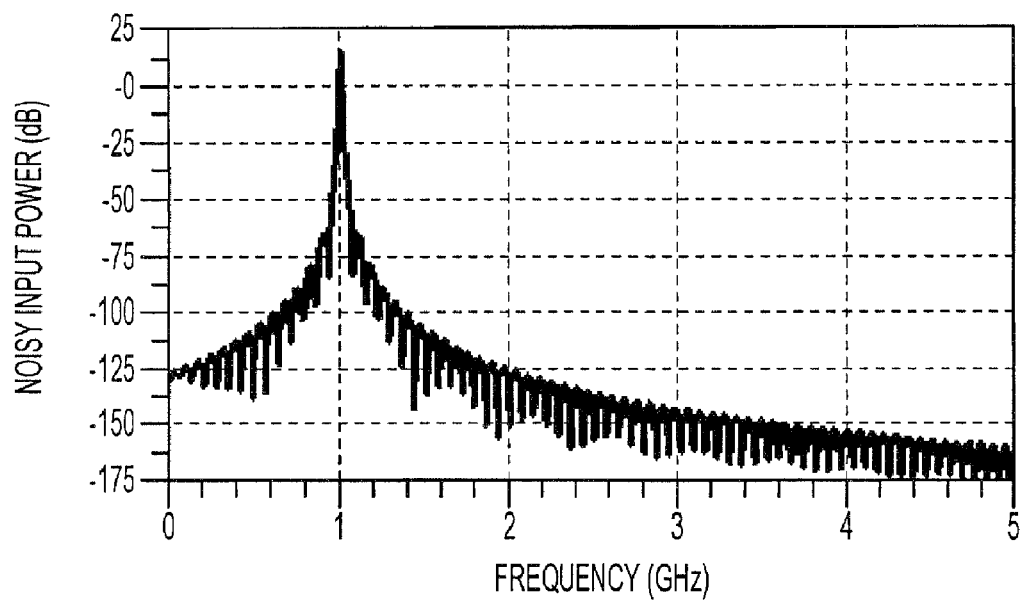
FIGS. 9A-9F show system simulation results of a phase noise measurement system according to an embodiment of the present invention.
Figure 9F:
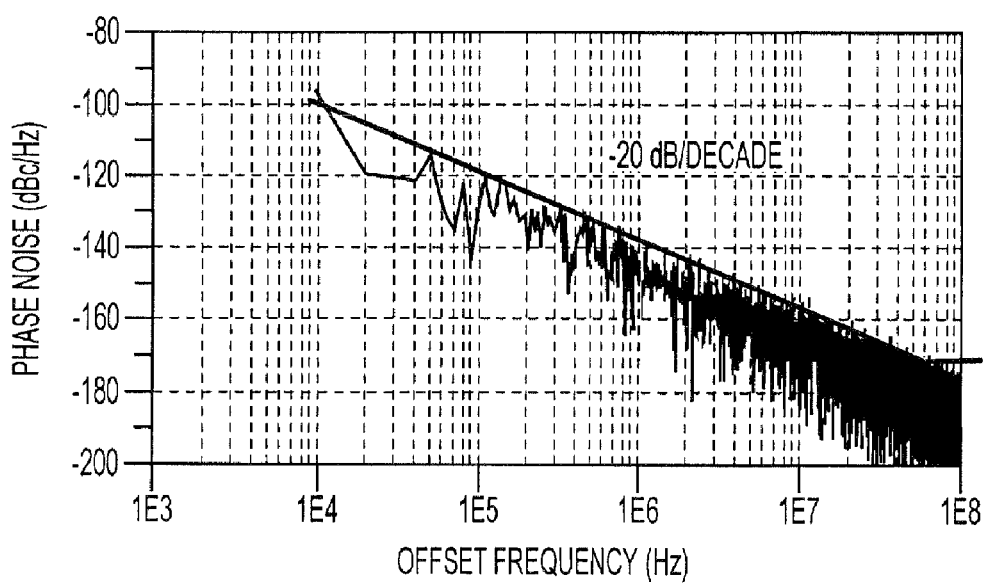
Figure 9C:
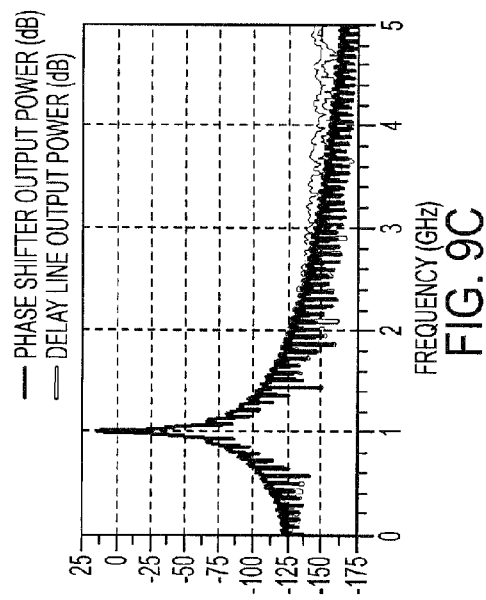
Figure 9E:
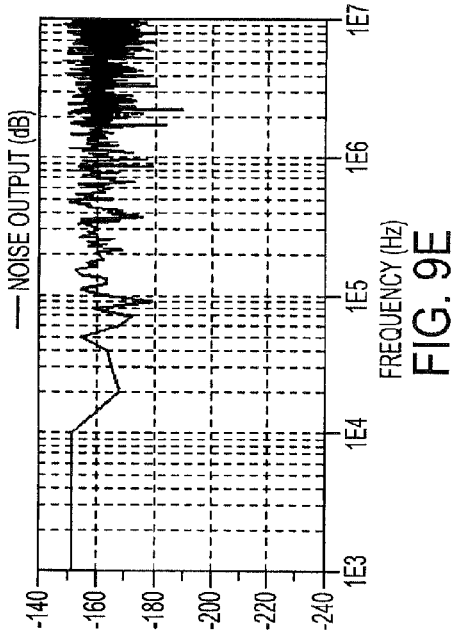
Figure 9B:
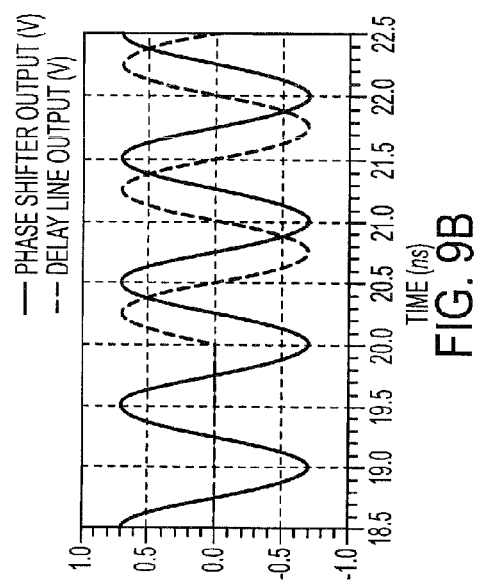
Figure 9D:
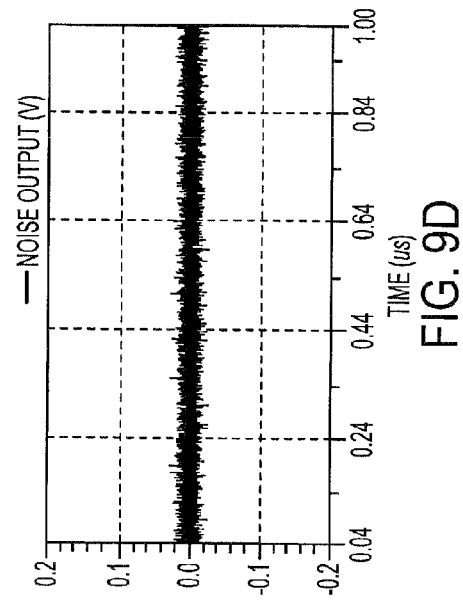

To illustrate the functionality of the embedded phase noise measurement system, FIGS. 9A-9F show plots illustrating responses of a simulated system in accordance with an embodiment of the present invention. FIG. 9A shows a noisy source signal and FIGS. 9B and 9C show the time domain and frequency domain signals, respectively, after passing through the delay line and phase shifter before entering the mixer. In the transient simulations, as shown in FIG. 9B, the delay line output shows the 20 ns delayed signal and, as shown in FIG. 9C, both spectrums show almost same response. FIGS. 9D and 9E show the transient and spectral response, respectively, of the output signal. As shown in FIG. 9D, in the time domain, there is only the noisy signal since the mixer cancels out the signal components by adjusting the input phase quadrature. In the transient simulation, the noise is scaled for ease of display. As shown FIG. 9E, the spectrum shows the output noise voltage, which can be converted into phase noise representation through equation (20) to achieve calibration. FIG. 9F shows the phase noise response obtained with respect to equation (21), below, which is same as equation (20) except in dB representation. In equation (21), B represents noise bandwidth which is decided by the spectrum analyzer's resolution bandwidth.

$$L(f_m)=S_v(f_m)-20\log(K_\phi 2\pi\tau_d)-20\log(f_m)-3-10\log(B) \quad (21)$$

The final spectrum after the calibration process through equation (21) is shown in FIG. 9F, which follows the expected results. In this simulation, the added noise power is relatively small (around −174 dBm). Accordingly, the final phase noise output shows very low system noise floor.

Figure 10A:
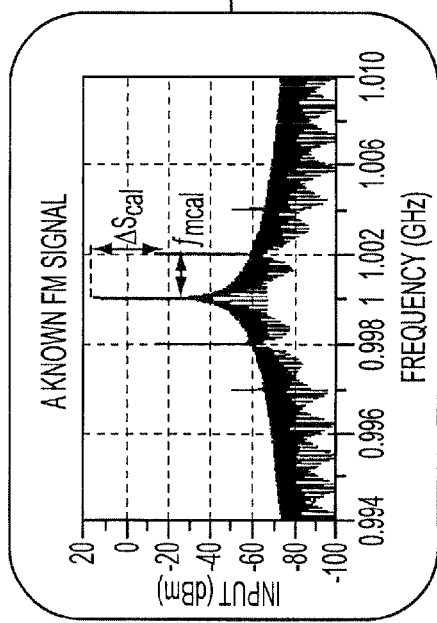
FIGS. 10A and 10B illustrate a calibration process in accordance with an embodiment of the present invention.
Figure 10B:
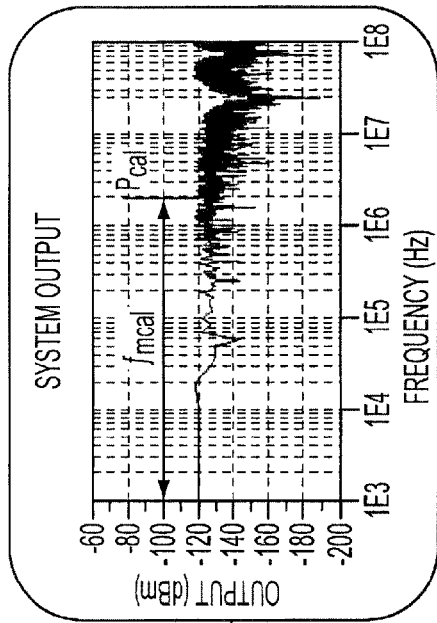
Figure 10B:
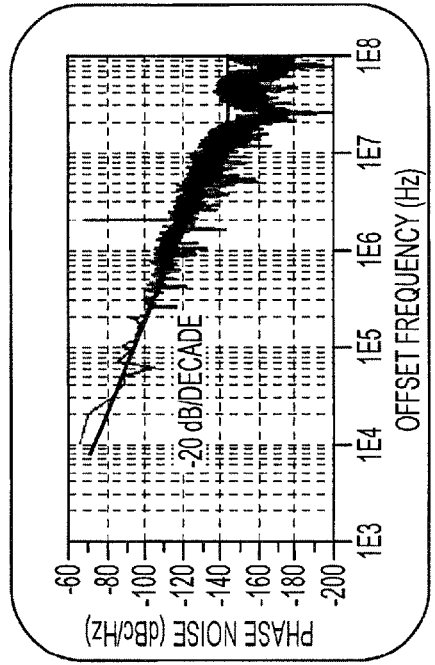

For the calibration, the second term in right-hand side of equation (21) can be obtained through the system gain calculation or through the calibration measurement. The calibration can be performed by inserting a single tone FM signal at the input, and then comparing the output signal with the input signal. FIGS. 10A and 10B illustrate an embodiment of the calibration procedure. A known single tone FM signal, as shown at the plot on the left in FIG. 10A, is inserted at the input of the system (Delay line Discriminator ($K_d$)). Then, the output signal, as shown at the plot on the right in FIG. 10A, shows the single tone output in the spectral domain since the signal is canceled out through the system. Equations (22) through (26), below, show the derivation of the calibration equation provided in the left hand portion of FIG. 10B in accordance with equation (21).

$$\frac{P_{ssb}}{P_{carrier}} = \frac{\beta^2}{4} \quad (22)$$
$$= \frac{1}{4}\frac{(\Delta f_{calpk})^2}{(f_{mcal})^2}$$
$$= \Delta S_{cal}$$

where $\Delta f_{calpk}$=the peak deviation, $f_{mcal}$=the FM rate of the calibration signal $$(\Delta f_{calrms})^2 = \frac{1}{2}(\Delta f_{calpk})^2 = 2f_{mcal}^2 10^{\frac{\Delta S_{cal}[dB]}{10}} \quad (23)$$

$$K_d^2 = \frac{\Delta V_{rms}^2}{\Delta f_{calrms}^2} = \frac{\Delta V_{rms}^2}{2f_{mcal}^2 10^{\frac{\Delta S_{cal}[dB]}{10}}} \quad (24)$$

$$K_d[dB] = P_{cal}[dB] - (\Delta S_{cal}[dB] + 20\log f_{mcal} + 3[dB]) \quad (25)$$

$$L(f_m)[dBc/Hz] = S_v(f_m) - K_d - 20\log(f_m) - 3 - 10\log(B) \quad (26)$$

This calibration procedure can be applied during applications of the present invention.

For the example illustrated in FIG. 10B, the value of $K_d$ is −77 dB. The system noise is higher than one shown in FIG. 9F because the FM modulated signal generates higher noise around the carrier signal, which results in a higher system noise floor.

The calibration procedure described above can be used to provide calibrated test results after system measurement data acquisition. The calibration procedure can be used in place of specifically deriving the system gain because by measuring the known single tone FM signal and using the calibration procedure, the system gain can be easily obtained.

Returning again to FIG. 8, it can be seen that the subject embedded phase noise measurement system functions as a frequency discriminator phase noise measurement system with on-chip integration capabilities.

According to an embodiment, a delay cell can be used to provide delay in place of the conventional transmission line delay line typically used in off-chip phase noise measurement circuits. The use of a delay cell can save chip area, while achieving the appropriate delay time. According to embodiments of the present invention, the delay cell can be realized using a differential inverting amplifier. Thus, an active delay line is provided.

Though not explicitly described in this disclosure, it is contemplated that embodiments may utilize other delay line paths, such as the transmission line or a lumped element delay cell (e.g., LC ladder filter). However, transmission lines using coaxial cables or coplanar waveguides may require a considerably longer line to achieve greater than 1 ns delay time. Furthermore, signal attenuation will need to be addressed when using the transmission line. Also, the lumped element delay cell may require several hundred stages to achieve enough delay time and its addition of resistive noise will need to be addressed. In particular, the LC ladder filter has a cutoff frequency which is relatively small compared to transmission line. This lower cutoff frequency achieves a bigger delay per stage for the LC ladder filter as compared to the transmission line, but the delay time per stage is considerably short.

Embodiments of the present invention can be applied to analog applications that are sensitive to signal distortion. Thus, in accordance with an embodiment of the present invention, a differential inverting amplifier with an output level shifter is used for the delay line.

Figure 11:
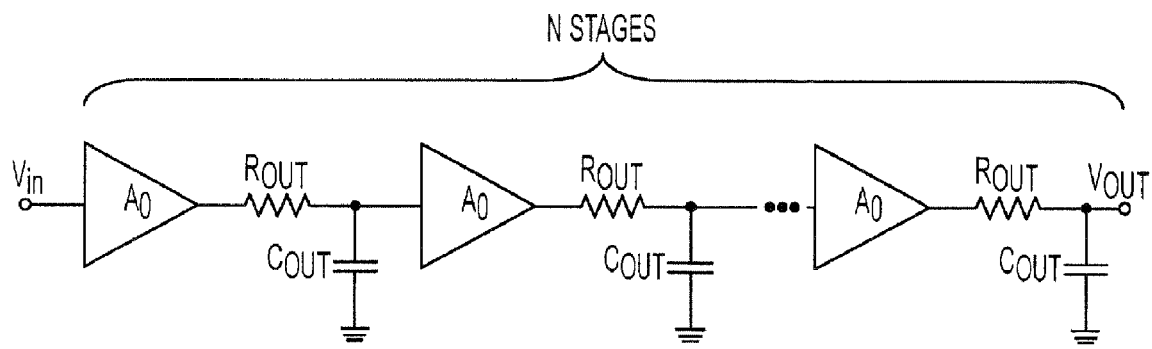
FIG. 11 shows a schematic representation of cascaded finite gain amplifiers.

The delay line using the differential inverting amplifier configuration can introduce a limited operational bandwidth. Also, in order to achieve enough delay for an accurate phase noise measurement, the delay line may include around 100 differential inverting amplifier stages in series. FIG. 11 shows a schematic representation of cascaded finite gain amplifiers. The gain and bandwidth of the delay line depends on the number of cascaded stages, N. In FIG. 11, each stage has an ideal voltage amplifier with gain $A_0$, an output resistance $R_{OUT}$, and a load capacitance $C_{OUT}$. The overall transfer function is given by equation (27).

$$H(s) = \left(\frac{A_0}{1+\frac{s}{\omega_c}}\right)^N \text{ where } \omega_c = \frac{1}{R_{OUT}C_{OUT}} \quad (27)$$

where $\omega_c$ is the −3-dB bandwidth of each stage. For more than 2 stages, the bandwidth of the overall circuit can be described as shown in equation (28).

$$\omega_{-3dB} = \omega_c\sqrt{\sqrt[N]{2}-1} \approx \frac{0.9}{N}\omega_c \quad (28)$$

Each stage in a differential inverting amplifier chain should achieve a very wide bandwidth in order not to distort the signal. Therefore, according to an embodiment, each stage of the delay line circuit can be designed to achieve around a 10 GHz 3-dB operational bandwidth. Also, the cascaded gain stages add the gain of each stage on a logarithmic scale. Therefore, if each stage gain is $A_0$, the total gain of N stages is N×$A_0$. For example, a 1 dB gain amplifier of 100 stages accumulates 100 dB, which is 100,000 in magnitude.

Figure 12:
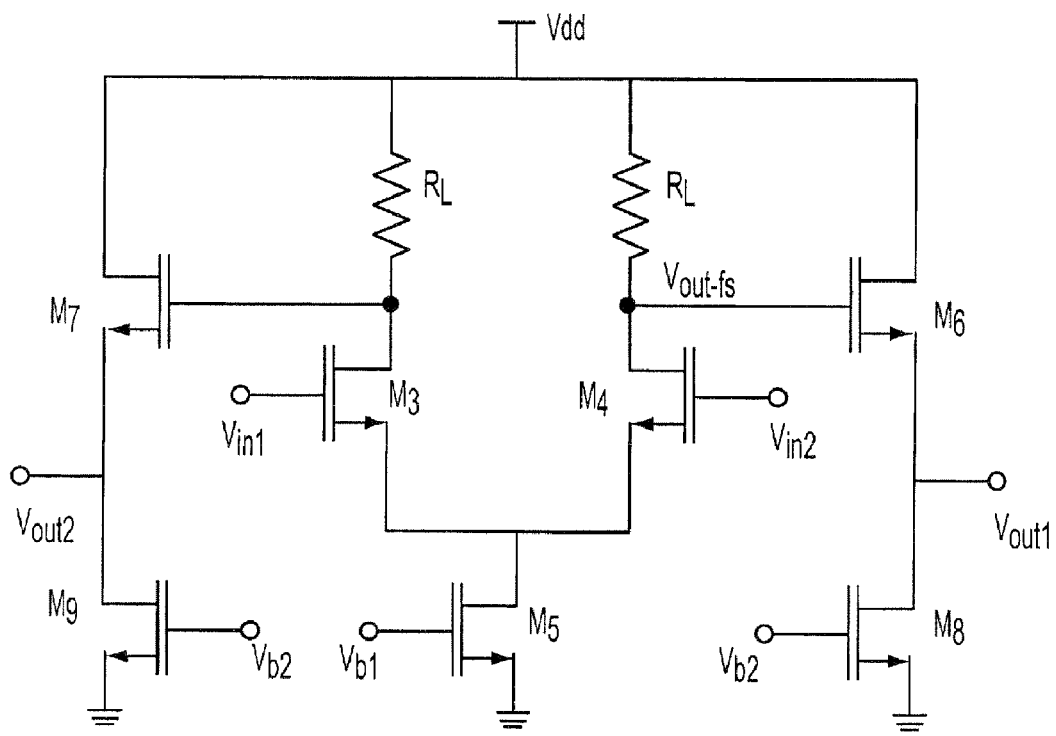
FIG. 12 shows a schematic of a delay line cell in accordance with an embodiment of the present invention.

A differential inverting amplifier (differential amplifier with load resistor) can be used in order to ensure the maximum operational bandwidth without using an inductive peaking technique. The subject differential inverting amplifier may have a large gain that can degrade the delay line response. Accordingly, to minimize the gain of each stage, a source follower can be added to each differential amplifier stage. A differential inverting amplifier and source follower circuit according to an embodiment of the present invention is shown in FIG. 12. The differential inverting amplifier (shown having transistors $M_3$, $M_4$, and $M_5$ and load resistors $R_L$) and source follower circuit (shown having transistors $M_6$, $M_7$, $M_8$, and $M_9$) can be cascaded to reach a desired delay for the delay line.

Figure 13A:
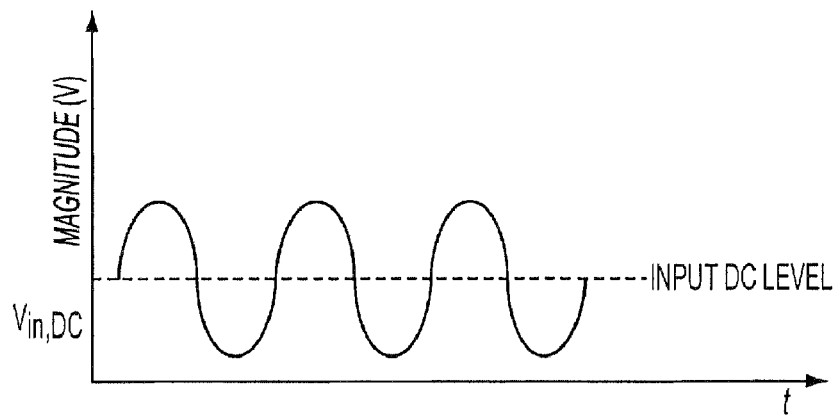
FIGS. 13A-13C show plots for explaining the transient response of the differential inverting amplifier of an embodiment of the present invention.
Figure 13B:
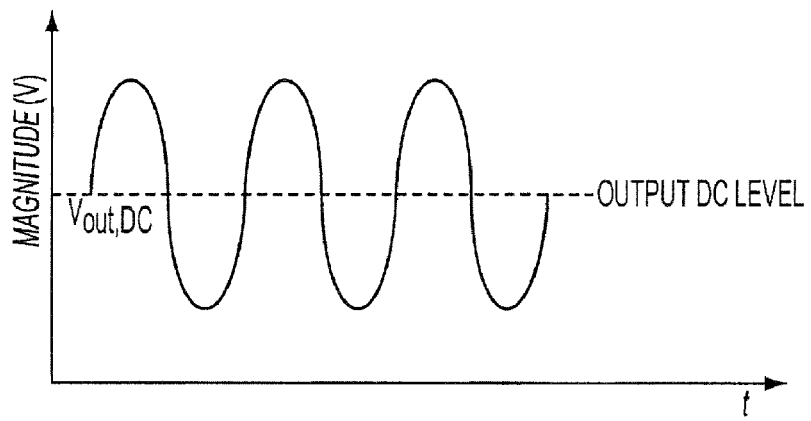
Figure 13C:
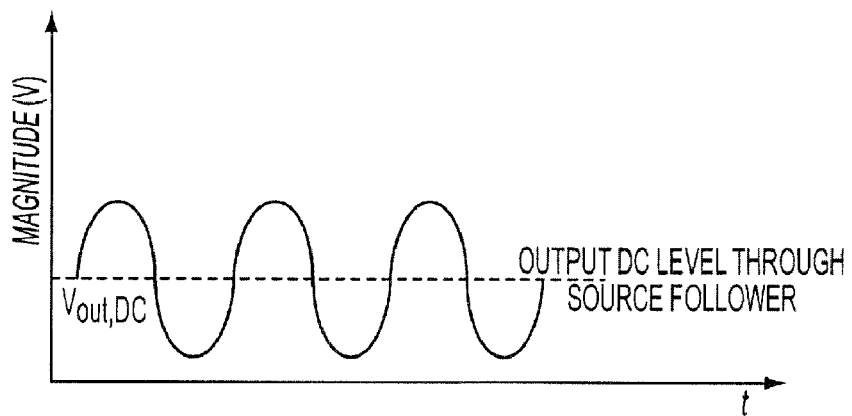

In particular, referring to FIGS. 12 and 13A-13C, it can be seen that the source follower can shift down the dc operating point of the circuit, while showing less than 0 dB gain with a relatively wide bandwidth due to the suppressed Miller capacitance. Therefore, each stage input can experience the same dc bias point. By adjusting the output dc level of the differential inverting amplifier, the stages are easily cascaded. FIG. 13A shows the input signal at $V_{in2}$, FIG. 13B shows the output signal at $V_{out-fs}$, and FIG. 13C shows the output signal at $V_{out1}$. As shown in FIGS. 13A and 13B, the first stage of the differential inverting amplifier increases the dc level and amplifies the signal. As shown in FIG. 13C, the source follower reduces the dc bias level and the signal amplitude. Therefore, the output signal preserves the same amplitude and dc bias as the input signal. Accordingly unwanted signal distortion can be minimized and the original signal can be applied to the output through many cascaded stages.

The delay time and operational bandwidth have a trade-off. The delay time is inversely proportional to the operational bandwidth. Therefore, a longer delay sacrifices the operation bandwidth, which in turn introduces unwanted signal distortion. According to an embodiment, the operational bandwidth can be maximized for a particular delay time by not using any feedback compensation elements.

Figure 14:
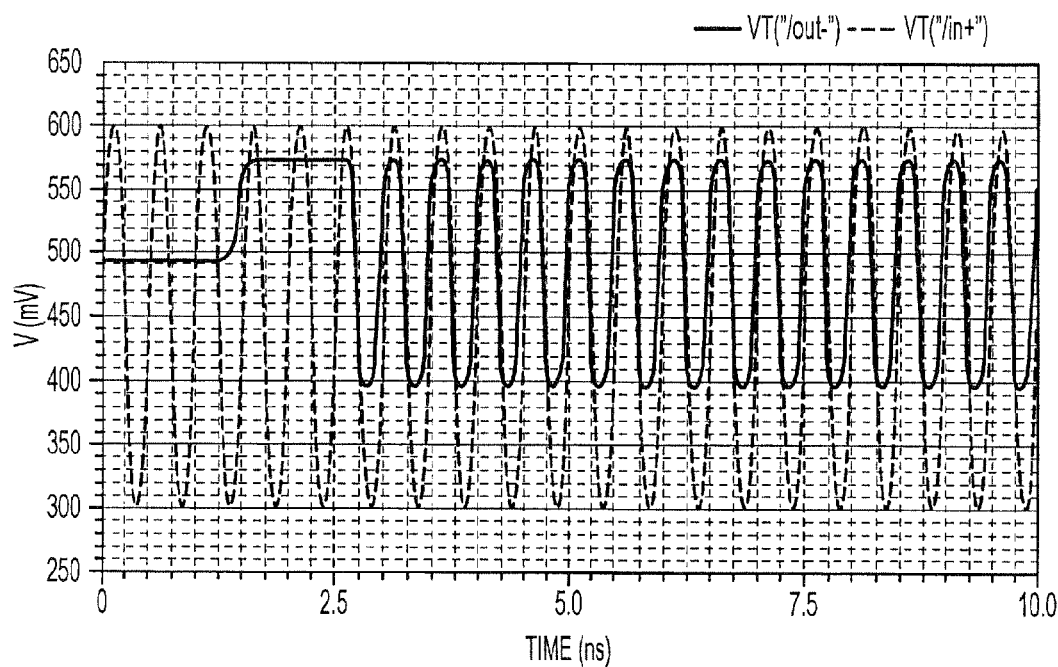
FIG. 14 shows a plot of the transient response of a delay line configured in accordance with an embodiment of the present invention.

According to embodiments of the subject phase noise measurement system, the delay time should be large enough to ensure an accurate measurement result. In one implementation, a 2.5 ns delay generation can be provided to measure up to a 20 MHz offset frequency. For example, each delay cell can generate a 26 ps delay with 8 GHz 3-dB bandwidth, and 100 stages of these delay cells can generate the long (e.g. 2.5 ns) delay time. FIG. 14 shows the transient simulation result of the 100 stage delay line. As shown in FIG. 14, the delay line can generate about 3 ns delay through the 100 stages with minimized signal distortion at 1 GHz frequency.

Figure 15:
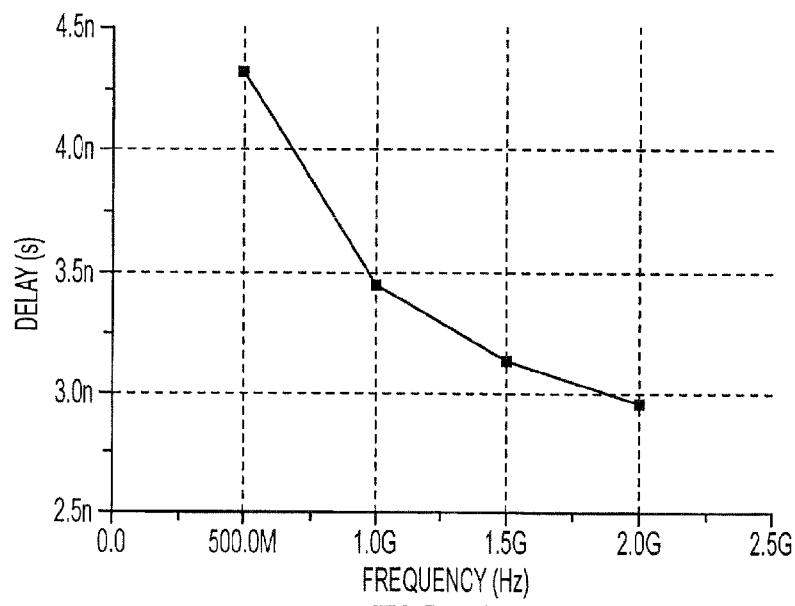
FIG. 15 shows a plot illustrating delay time variation dependence on operation frequency.

FIG. 15 shows the delay variation of the delay line depending on the operational frequency. At smaller bandwidths, the delay time is increased in the same environment. Through the simulations over the entire frequency range, the power consumption is almost the same, around 60 mW, for 100 stages. Gain also varies depending on frequency. For the comparison, the gain of delay line is controlled through the source follower and current source of the first stage of the delay line cell. Here, the delay time is calculated by observing the first rising point of the delayed signal. In one embodiment, the delay stages are configured to each have a gain of less than about 1 by using real active amplifiers.

Returning again to FIG. 8, an analog phase shifter 14 is arranged along a parallel signal line to the analog delay line 13. The analog phase shifter of the subject embedded noise measurement system can be an active phase shifter that is based on a variable delay cell.

The subject phase shifter can be configured to operate over a wide frequency range. In an embodiment, the subject phase shifter can incorporate a variable delay line, which is capable of operating over a relatively wide frequency and tuning range. For example, a dc~2 GHz oscillator phase noise measurement can be achieved. In contrast, a lumped-element structure with variable capacitance, referred to as a lumped-element phase shifter, is fixed at a narrow operational frequency and may have a limited phase shift capability.

The variable delay circuit in the time domain can function similarly to a phase shifter in the frequency domain. In addition, as described above with respect to FIG. 8, phase quadrature can be controlled automatically by using a phase shifter control. The phase shifter control can be a voltage controlled inverting amplifier. The output dc voltage level of the system (see node at output of the third balun 16 of FIG. 8) can be compared with a reference voltage $V_{ref}$ using, for example, a comparator, whose output controls the voltage controlled inverting amplifier. If the mixer does not operate in phase quadrature, the output signal power is large enough to make an adjustment at a very small phase discrepancy. A detailed explanation of an embodiment of the phase shifter control is described in reference to FIG. 26.

According to one embodiment of the present invention, the subject embedded phase noise measurement system can be designed for measurements from several hundred MHz up to 2 GHz. To achieve this specification, the phase shifter can utilize a variable delay cell that can control its output to produce a wide range of delay time to adjust the input to the mixer to be 90° out of phase. Also, the phase shifter can keep the output signal at substantially the same amplitude as the input in order to minimize signal distortion. Accordingly, in one embodiment, the phase shifter can incorporate a variable resistance delay cell with a source follower to adjust the output dc level to the next cell input dc level and inhibit signal distortion. In addition, a bias adjustment circuit can be included to produce a stable output dc level.

Figure 16:
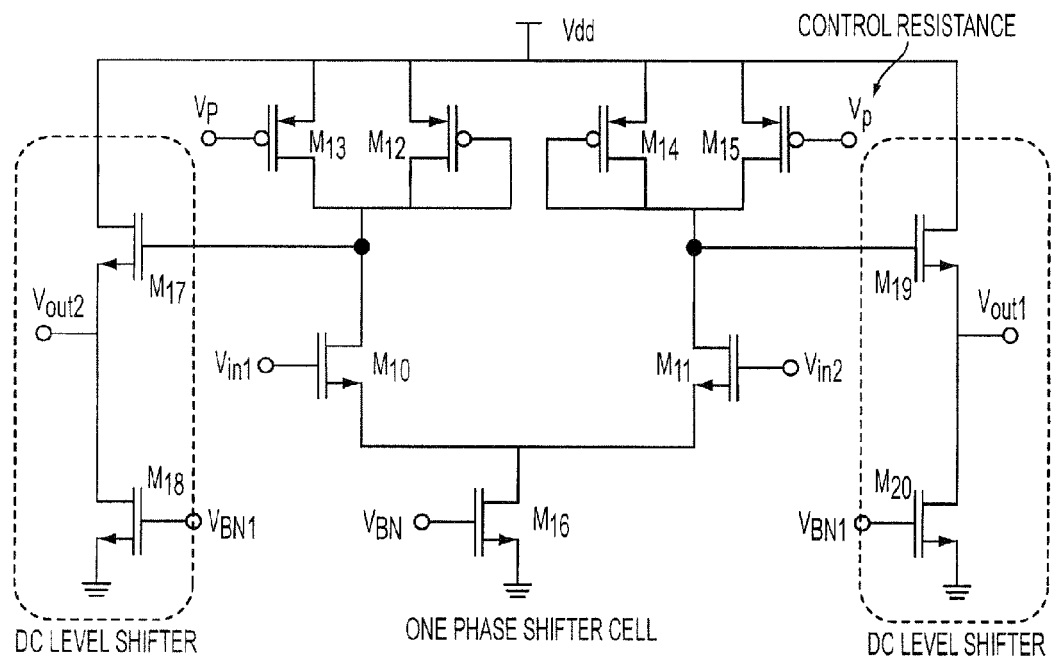
FIG. 16 shows a basic cell of a phase shifter in accordance with an embodiment of the present invention.

FIG. 16 shows a schematic of a variable delay stage of a variable delay line that can be used in accordance with an embodiment of the present invention. The load element can include a diode-connected PMOS device ($M_{12}$ and $M_{14}$) in shunt with an equally sized externally biased PMOS device ($M_{13}$ and $M_{15}$) that produces symmetric load characteristics. The two PMOS device pairs can create a symmetric load in order to make the load resistance looking into $M_{12}$ and $M_{13}$ linear and dependent on the control voltage ($V_p$). Ideally, by the standard quadratic model of a long channel MOS, the I-V characteristics of the symmetric loads are completely symmetric about the center of the voltage swing. The load swing is defined from the $V_{dd}$ rail supply to the bias voltage for the $M_{13}$ and $M_{15}$ PMOS devices. The effective resistance of a symmetric load is directly proportional to the small signal resistance at the ends of the swing range. This small signal resistance is ~$1/g_m$, where $g_m$ is the transconductance, for one of the two equally sized devices when biased at $V_p$ as shown in equation (29).

$$t_{delay} = R_{eff} C_{eff} = \frac{C_{eff}}{g_m} \qquad (29)$$

where $R_{eff}$ and $C_{eff}$ are the effective output resistance and capacitance of the first stage of the variable delay cell, respectively. Accordingly, the delay time may be determined by the symmetric load resistance.

The PMOS bias voltage for the load element is controlled so that the load current at the point of symmetry equals one half of the differential pair bias current. The PMOS bias voltage can be generated simply by connecting the bias voltage to the output of a dummy load element biased by a differential pair bias current. This connection can establish the PMOS bias voltage as the lower dc voltage swing limit, the point where the load current equals the differential pair bias current. Alternatively, the differential pair bias current can be established for a given PMOS bias voltage using a replica-feedback bias circuit as shown in FIG. 17.

The MOS realization of symmetric loads has additional advantages beyond high dynamic supply noise rejection characteristics. Because the higher gain region occurs at the center of the voltage swing, the delay cells can provide adequate gain for generating signal delay over a broad frequency range. Furthermore, because the load resistance of symmetric loads decreases towards the ends of the voltage swing, the transient swing limits will be well defined near the dc swing limits, resulting in reduced noise sensitivity. In addition, the IC layout for the differential delay cell can be very compact.

Figure 17:
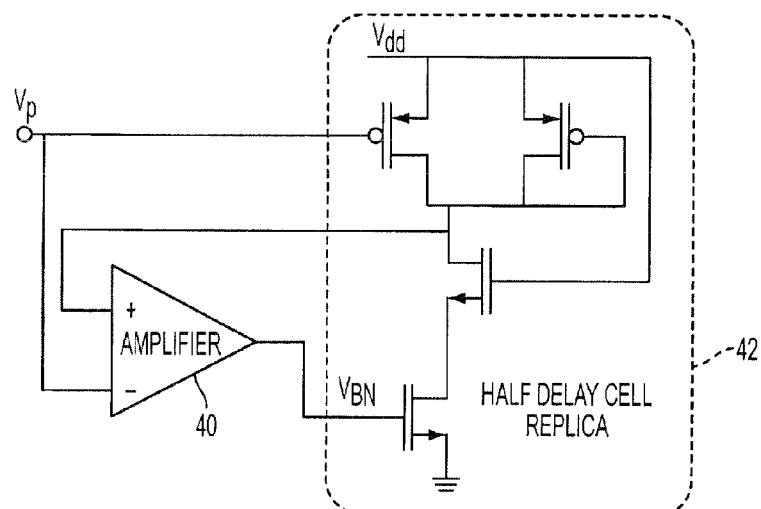
FIG. 17 shows a simplified schematic of a self-biased replica-feedback current source bias that can be used for the differential variable delay cell stage.

Referring to FIGS. 16 and 17, the bias circuit of FIG. 17 sets the current through the simple NMOS current source (through $M_{16}$) in the delay cells in order to provide the correct symmetric load swing limits. In addition, the bias circuit can adjust the NMOS current source bias ($V_{BN}$) dynamically so that this current is held constant and highly independent of supply voltage in order to counteract the effect of the finite output impedance of the simple NMOS current source and achieve high static supply noise rejection.

The current source bias circuit includes a single-stage differential amplifier 40 and a replica 42 of half the buffer stage. The amplifier 40 adjusts the current output of the NMOS current source so that the voltage at the output of the replicated load element is equal to a control voltage, a condition required for correct symmetric load swing limits. The net result is that the output current of the NMOS current source is established by the load element and is independent of the supply voltage (Vdd). As the supply voltage changes, the drain voltage of the NMOS current source devices varies. However, the gate bias ($V_{BN}$) is adjusted by the amplifier 40 to keep the output current constant, counteracting the effects of the current source finite output impedance.

Figure 18:
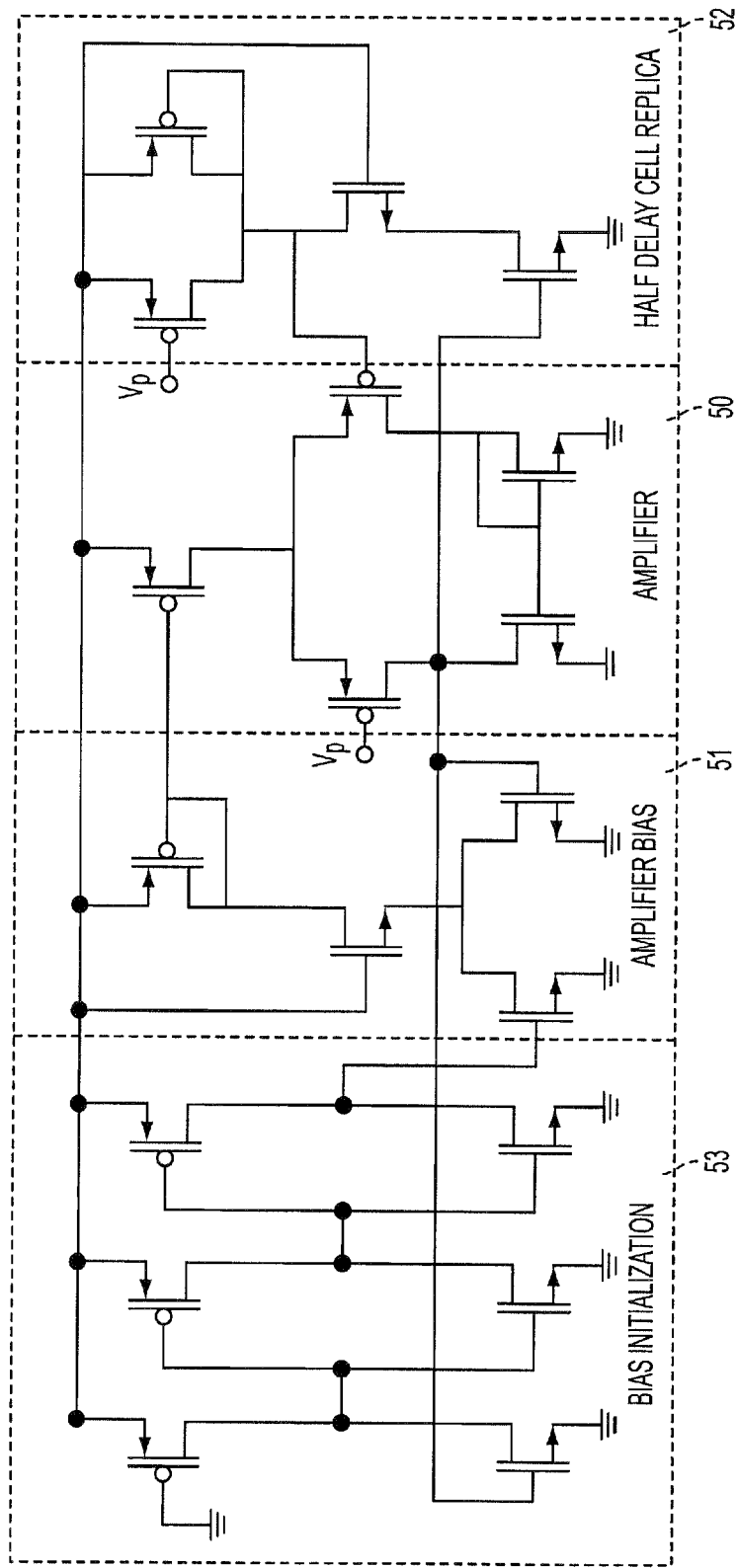
FIG. 18 shows a schematic of the self-biased replica-feedback current source bias of FIG. 17 that can be used for the differential variable delay cell stage.

By reducing the amplifier's supply voltage requirement, limitations on the delay cell supply voltage operating range can be minimized. As shown in FIG. 18, which provides one specific embodiment of a biasing circuit, an amplifier 50 based on a self-biased PMOS source coupled pair can be used in order to reduce the amplifier's supply voltage requirement. Here, the current densities of the PMOS source coupled pair devices and the PMOS current source device can be, for example, one quarter of that in the PMOS symmetric load devices ($M_{12}$, $M_{13}$, $M_{14}$, and $M_{15}$) of the delay cell shown in FIG. 16 in order for the PMOS current source device in the amplifier 50 to remain in saturation. An amplifier bias 51 can be generated from the same NMOS current source bias through a stage that mirrors, using flipped circuit topology, the half-delay cell replica 52 so that amplifier supply voltage requirements are similar to those of the buffers and the amplifier bias current is highly independent of supply voltage. This replica bias stage 52 is used to inhibit variation of the input offset of the amplifier 50 due to supply voltage, which also causes the output current of the NMOS current source to also change with supply voltage. Because the amplifier may be self biased at multiple operating points, the bias circuit can be made stable with the amplifier unbiased and an NMOS current source biased at the negative supply. As a result, all initialization circuit 53 can be used to bias the amplifier at power-up to the exact operating point. This initialization circuit inhibits the NMOS current source bias from completely turning off the bias current sources to a stable zero current operating point.

The compensation for stable operation is incorporated because the current source bias circuit shown in FIG. 18 contains a feedback loop with two gain stages and with two significant poles. The pole at the amplifier output will dominate with much higher output impedance than the pole at the half-delay cell replica output. Therefore, to increase the phase margin of the bias circuit, the compensation limits the capacitive output load of the simple NMOS current source gates in the delay cell stages. By selecting the output load to be about ten delay cell stages, each having devices of the same size as the corresponding devices in the bias circuit, the output recovery time of the bias circuit can be inhibited from limiting the dynamic supply noise rejection of the delay cells. With no required reference voltage, the only external bias of the circuit shown in FIG. 18 is the control voltage ($V_p$). Although no device cascading is used, the resultant static supply noise rejection is equivalent to that achievable by a delay cell stage and a bias circuit with cascading, without requiring an extra supply voltage. The total supply voltage requirement of the buffer state and bias circuit is slightly less than a series NMOS and PMOS diode voltage drop with identical current densities.

Figure 19:
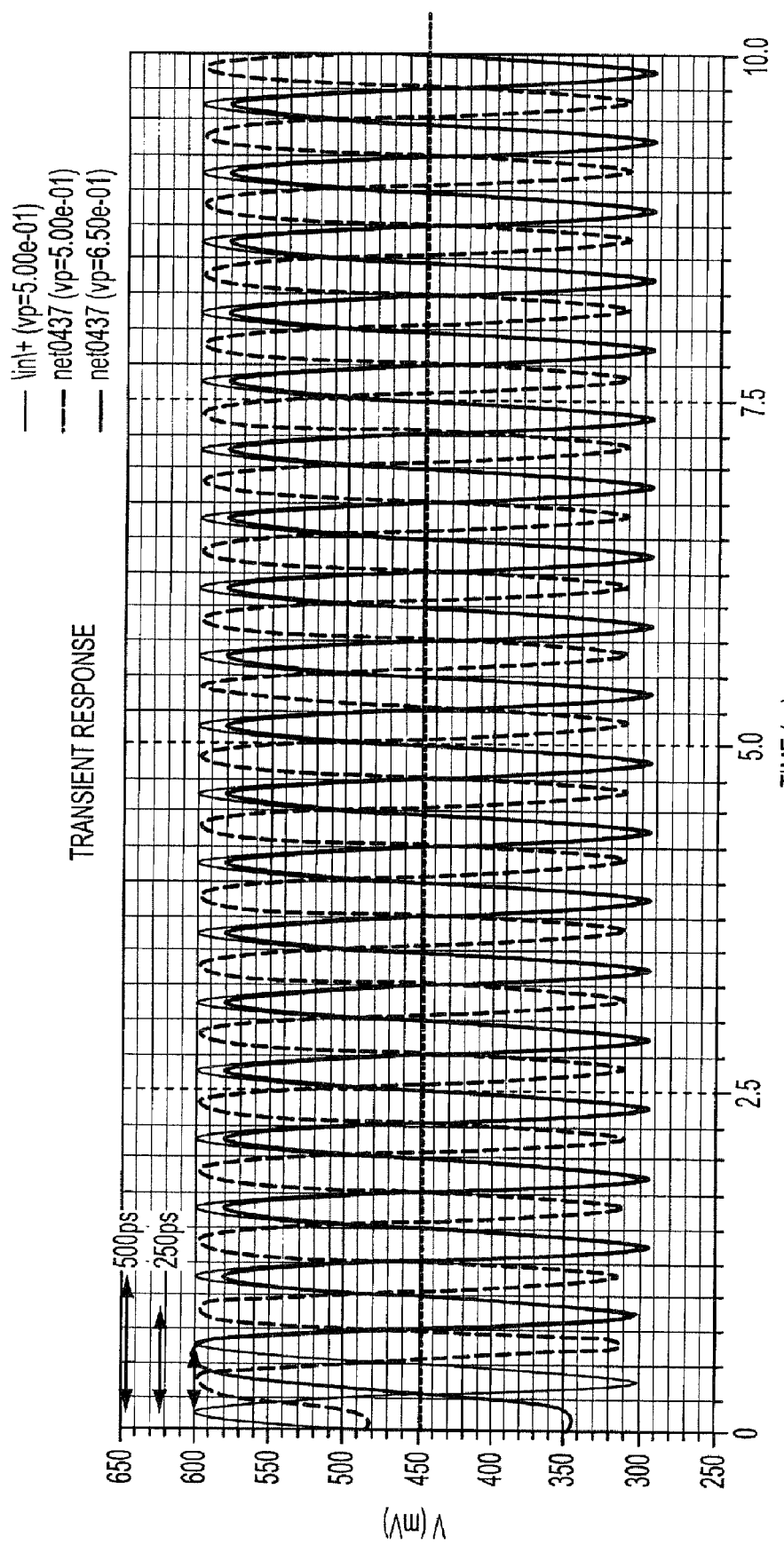
FIG. 19 shows transient simulation results for a PMOS load bias $V_p$ of 0.5 V and 0.65 V for a 6-stage variable delay cell in accordance with an embodiment of the present invention.

FIG. 19 shows a transient simulation results for an embodiment of the variable delay cell. The source follower produces an output dc level that feeds into the input dc level, which is similar to the delay line architecture of FIG. 12 except for its symmetric load. In this way, the output level of the variable delay cell can inhibit the signal from producing unwanted distortion. Phase control up to 500 MHz can be achieved by cascading six stages of the subject variable delay cell. Referring to FIG. 19, the maximum variable delay for the six stages can be adjusted to 500 ps at 1 GHz (for $V_p$–0.65V). In the frequency domain, the delay module cam adjust the phase quadrature up to 500 MHz. In this simulation, the circuits use a 1.2 V power supply in order to minimize power consumption. The simulated dc power consumption is 12 mW.

According to one embodiment, the self-biased replica current source bias for the differential variable delay cell stage can compensate the output dc level by adjusting the current source due to symmetric load variation. Then, the source follower buffer cell restores the output dc level to the input dc level.

Referring yet again to FIG. 8, a mixer 15 is used to compare the phase information of the signals output from the analog delay line and the analog phase shifter. The mixer works as a phase detector and can include an input structure and an output structure for frequency and voltage conversion. Where the delay line and phase shifter have the same frequency and amplitude, the output of the mixer provides a dc signal proportional to the phase difference between the delay line signal and the phase shifter signal.

According to an embodiment of the present invention, the subject mixer can be a double balanced mixer. The double balanced mixer can include a passive ring mixer as the input structure 15a and an active RC filter as an output structure 15b. The double balanced mixer with active RC filter can provide high linearity, little or no flicker noise generation, and low power consumption.

Two common mixer circuits include balanced and passive mixers. A Gilbert mixer is one type of balanced mixer. A Gilbert quad mixer is a double balanced, four-MOSFET mixer that has passive mixer characteristics. The Gilbert quad mixer is really a type of folded ring mixer. However, the biasing levels provide the main distinguishing characteristic between the Gilbert quad mixer and the folded ring mixer. In particular, the Gilbert quad mixers are biased nominally into saturation and have dc current, while the passive ring mixers are biased near the FET threshold and have no dc current.

Figure 20:
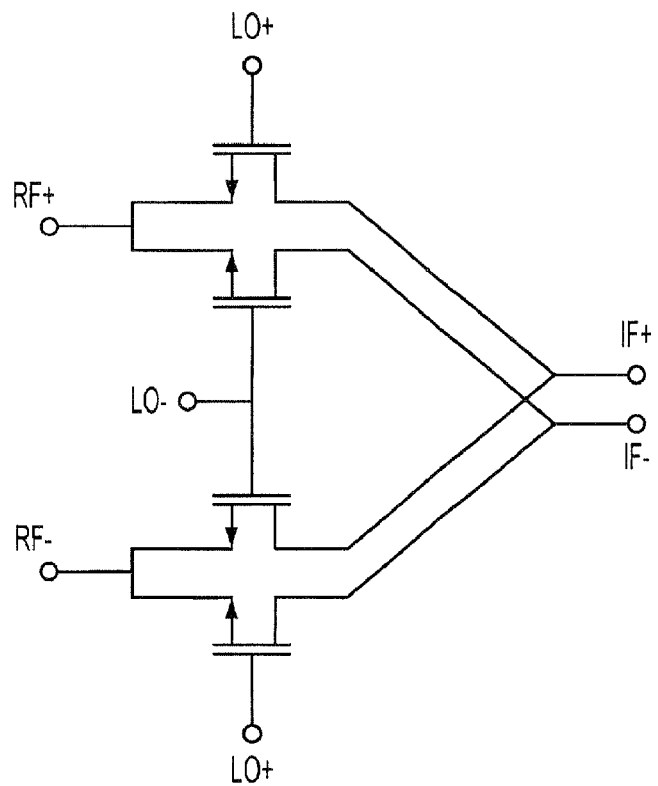
FIG. 20 shows a simplified schematic of a passive ring mixer (bias not shown) that can be incorporated in an embodiment of the subject phase detector.

In accordance with one embodiment of the present invention, a Gilbert quad mixer, as shown in FIG. 20, can be used as the passive ring mixer input structure. Gilbert mixers convert an incoming RF voltage into a current through a transconductor, whose linearity and noise figure set a firm bound on the overall mixer linearity and noise figure. This circuit uses voltage-controlled current sources in a V-I converter circuit for a voltage-controlled resistance. The resistance of a triode-region MOSFET varies in a manner inversely proportional to the incoming RF signal. If the voltage between the mixer transistor drain and the source is maintained at a fixed value, the current flowing through the device will be a faithful replica of the RF voltage, and if the drain-source voltage varies with the local oscillator (LO), then the current will be proportional to the product of the LO and RF signals. The use of a double balanced structure cancels out the common-mode dc biasing signals and the nonlinear dependence of $g_{ds}$ on $V_{ds}$.

The dc biasing levels of the RF and LO signals are carefully selected to minimize the occurrence of severe distortion due to the pass-transistors not being kept in the triode region at all times. The smallest possible level that can appear at the gates of the transistors should be at least a threshold voltage $V_T$ higher than the largest possible source level. Otherwise, the transistors will be turned off during the mixing period. Saturation of the pass-transistors will appear when the largest drain-source voltage $V_{ds}$ becomes higher than the smallest $V_{gs}-V_T$. However, saturation does not directly result in distortion. The cross-coupled double balanced structure cancels out the quadratic components in the voltage-to-current conversion characteristic of the pass-transistors.

Figure 21:
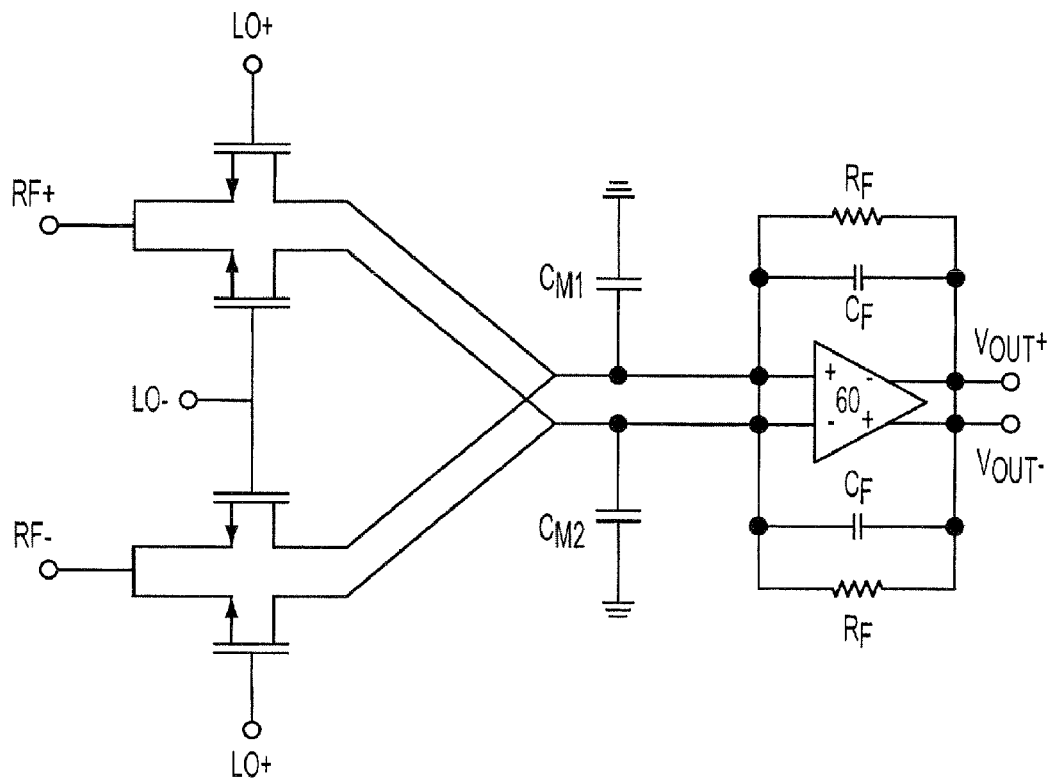
FIG. 21 shows a schematic of a phase detector (bias not shown) in accordance with an embodiment of the present invention.

As described above, the subject double balanced mixer can include the passive ring mixer as shown in FIG. 20 and an active RC filter. Accordingly, in one embodiment, the final down-conversion mixer circuit can be as shown in FIG. 21. The output from the phase shifter can be used as the LO+ and LO− signals to the mixer circuit, and the output from the delay line can be used as the RF+ and RF− signals to the mixer circuit.

Referring to FIG. 21, two capacitors ($C_{M1}$ and $C_{M2}$) are included between the output of the mixer and the input of the filter. The capacitors $C_{M1}$ and $C_{M2}$ can be attached to virtual ground nodes. The output stage (15b of FIG. 8) of the subject double balanced mixer converts the output current of the mixing transistors back into a voltage. As shown in FIG. 21, the output stage is an active RC filter having an operational amplifier (opamp 60) and feedback resistors. The output stage produces a low-frequency output signal, but the input stage should operate for all frequencies. According to an embodiment, this can be accomplished by substantially reducing or eliminating high frequency signals at the virtual ground nodes of the mixer. For example, the feedback structure connected to the operational amplifier can create the virtual ground at its inputs. The transistors in the input stage (passive ring mixer) operate as pass-transistors for high-frequency signals when the frequency capability of the operational amplifier is not high enough. Therefore, the capacitors $C_{M1}$ and $C_{M2}$ are used to filter out the high frequency currents injected to the virtual ground nodes, such that conversion of the high frequency currents into voltages can be minimized. The operational amplifier still generates a virtual ground for low frequency signals. By using the capacitors $C_{M1}$ and $C_{M2}$ between the output of the mixer and the input of the filter, the input structure (passive ring mixer) can be optimized for high frequency operation (more than 1 GHz) while the operational amplifier can be designed for low-frequency operation (up to several hundreds of MHz). The capacitors $C_{M1}$ and $C_{M2}$ have capacitances magnitudes greater than the intrinsic capacitances of the circuit. For example, the capacitors $C_{M1}$ and $C_{M2}$ can be sized to provide several pF of capacitance.

The subject active RC filter can be designed to provide low power consumption. In addition, the subject RC filter can illustrate high linearity. In a further embodiment, the RC filter can be selected to have a wide operational bandwidth. Embodiments of the present invention are targeted to measure phase noise at several offset frequencies (e.g. 600 kHz, 1 MHz, 3 MHz and 10 MHz) depending on the test device technology standard. Accordingly, a specific embodiment of the subject active RC filter has at least a 50 MHz 3-dB bandwidth.

Generally, integrated continuous-time high frequency baseband filters employ either gm-C or MOSFET-C topologies with automatic tuning methods. However, the trend towards low supply voltage introduces new challenges in the realization of these techniques. For gm-C filter types, it can be difficult to achieve a broad dynamic range and good linearity performance with low power consumption, whereas CMOS implementations suffer from reduced programmability. The MOSFET-C approach may be better than gm-C in terms of power dissipation and noise performance, but linearity and tuning range may be poor for low supply voltages. According to an embodiment, the operational amplifier 60 of the filter can operate on a 1.2 V supply. A compensation technique can be incorporated to improve current consumption, while minimizing stability problems in the presence of an output load.

Figure 22:
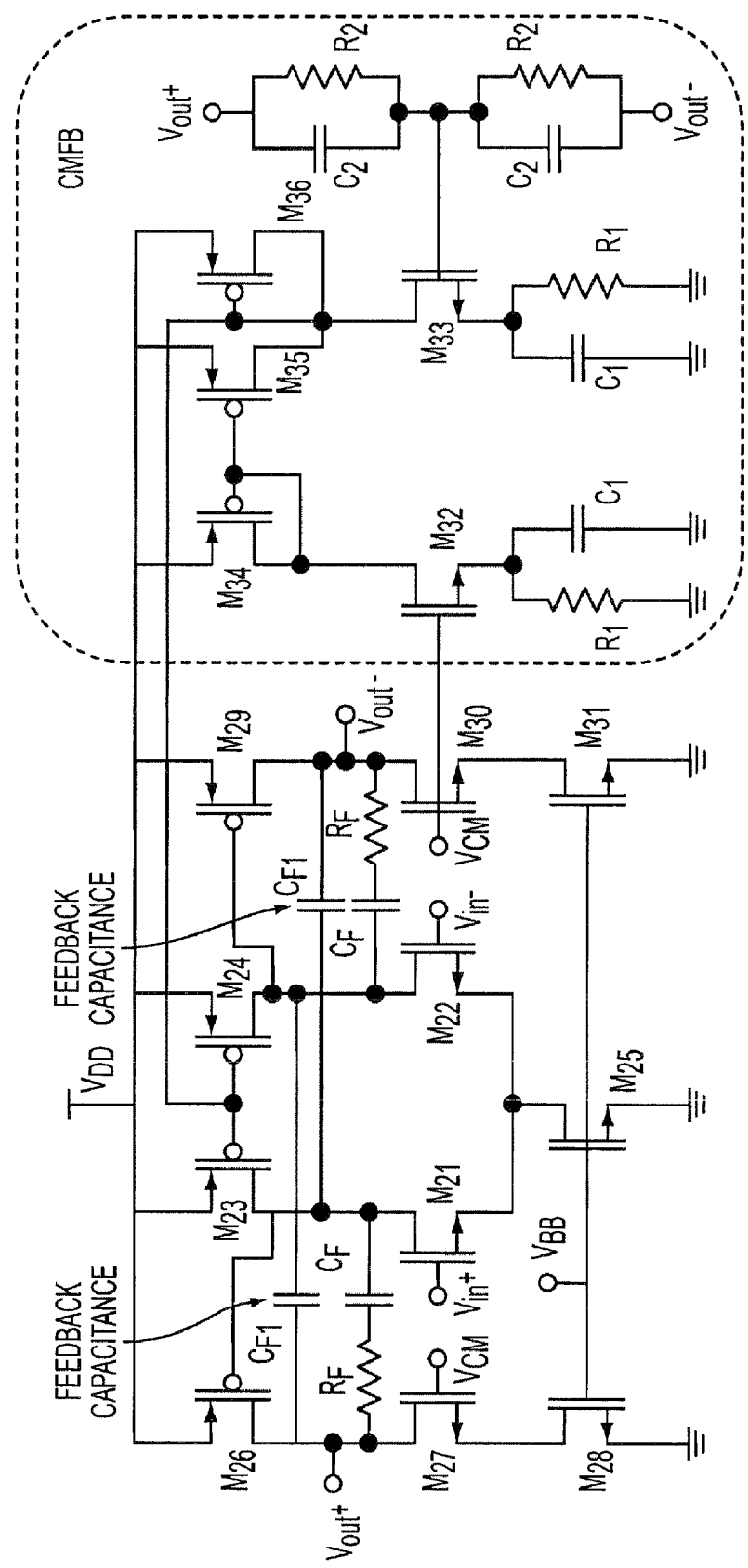
FIG. 22 shows a schematic of a circuit for the operational amplifier of FIG. 21 (bias not shown).

FIG. 22 shows a schematic of a circuit for the subject operational amplifier. Referring to FIG. 22, the system includes a differential input stage, an output stage, and a common mode feedback (CMFB) circuit.

A compensation technique can be implemented to expand the amplifier's bandwidth without a loss of a gain. In one embodiment, the compensation technique involves placing two cross-coupled capacitors $C_{F1}$ between the input differential pair and the output buffer. These capacitors act as a negative capacitance of the input transistors, thus generating an anti-pole-splitting, behavior that augments the amplifier's gain-bandwidth product. The compensation capacitors ($C_{F1}$) are cross connected to the outputs of the first and second stages of the amplifier, which is combined with the classic Miller RC compensation (series connection of $R_F$ and $C_F$ between the input differential pair and output buffer). The above described compensation technique provides not only an anti-pole-splitting behavior, but also a phase-controlling action that holds the output phase away from −180° for frequencies spanning far beyond the unity gain frequency, thus providing extra bandwidth and adequate phase margin.

Figure 23:
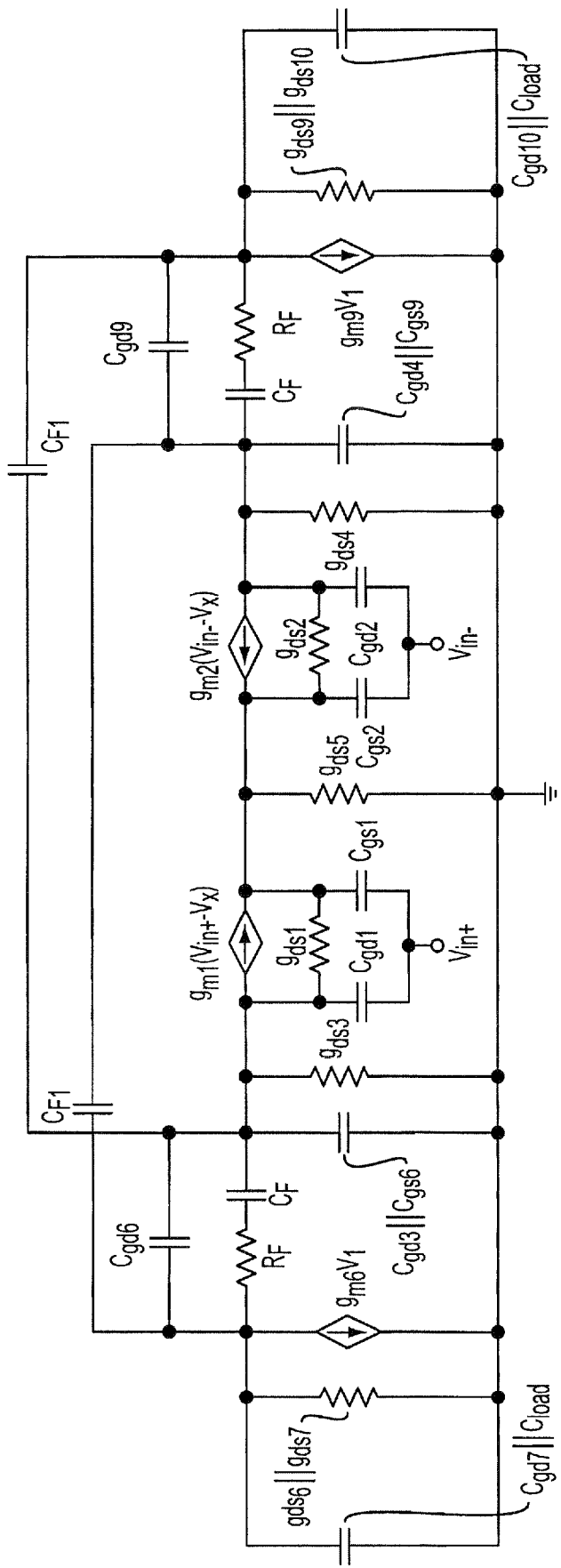
FIG. 23 shows an AC modeling of an operational amplifier in accordance with an embodiment of the present invention.

FIG. 23 shows a simplified AC equivalent model of the amplifier shown in FIG. 22 with an output capacitance $C_{load}$. The differential open-loop voltage gain is described in equation (30). For the sake of simplicity, a third order term in the denominator is omitted since its contribution is marginal at the frequency range of interest compared to the lower order terms. The impedance of the current source transistor will be very large. By symmetry, $M_{21}$ and $M_{22}$, $M_{23}$ and $M_{24}$, $M_{26}$ and $M_{29}$, $M_{27}$ and $M_{30}$, and $M_{28}$ and $M_{31}$ (shown in FIG. 22) are equal.

$$A(s) = \frac{V_{out}}{V_{in}} \quad \text{Equation (30)}$$

$$= \frac{\left(\dfrac{R_F C_F (C_{gd6} - C_F)s^2 + \left(\dfrac{C_F + C_{gd6} -}{C_{F1} - g_{m6} R_F C_F}\right)s - g_{m6}}\right)(-g_{m1} + sC_{gd1})}{Ds^3 + \left(\dfrac{C_F C_{F1}}{(4 - g_{m6} R_F)} + E\right)s^2 + (g_{m6}(C_F - C_{F1}) + F)s + (g_{ds1} + g_{ds3})(g_{ds6} + g_{ds7})}$$

$$\approx \frac{\left(\dfrac{R_F C_F (C_{gd6} - C_F)s^2 + \left(\dfrac{C_F + C_{gd6} -}{C_{F1} - g_{m6} R_F C_F}\right)s - g_{m6}}\right)(-g_{m1} + sC_{gd1})}{(C_F C_{F1}(4 - g_{m6} R_F) + E)s^2 + (g_{m6}(C_F - C_{F1}) + F)s + (g_{ds1} + g_{ds3})(g_{ds6} + g_{ds7})}$$

where $$D = R_F C_F \left( (C_{gd6} + C_{gd7} + C_{F1} + C_{load}) \begin{pmatrix} C_{gd1} + C_{gd3} + \\ C_{gd6} + C_{gs6} + C_{F1} \end{pmatrix} - (C_{gd6} - C_{F1})^2 \right) \quad (31)$$

$$E = \begin{pmatrix} C_{gd1} + C_{gd3} + \\ C_{gd6} + C_{gs6} + C_{F1} \end{pmatrix}\begin{pmatrix} C_{gd6} + C_{gd7} + \\ C_{F1} + C_{load} \end{pmatrix} - (C_{gd6} - C_{F1})^2 + R_F C_F \left( (g_{ds6} + g_{ds7})\begin{pmatrix} C_{gd1} + C_{gd3} + \\ C_{gd6} + C_{gs6} + C_{F1} \end{pmatrix} + (g_{ds1} + g_{ds3})\begin{pmatrix} C_{gd6} + C_{gd7} + \\ C_{F1} + C_{load} \end{pmatrix} + g_{m6} C_{gd6} \right) \quad (32)$$

$$F = (g_{ds6} + g_{ds7})\begin{pmatrix} C_{gd1} + C_{gd3} + \\ C_{gd6} + C_{gs6} + C_{F1} \end{pmatrix} + (g_{ds1} + g_{ds3})\begin{pmatrix} C_{gd6} + C_{gd7} + \\ C_{load} + C_{F1} \end{pmatrix} + g_{m6} C_{gd6} + R_F C_F (g_{ds1} + g_{ds3})(g_{ds6} + g_{ds7}) + C_F \begin{pmatrix} g_{ds1} + g_{ds3} + \\ g_{ds6} + g_{ds7} \end{pmatrix} \quad (33)$$

The terms E and F depend on parasitic capacitances and output load capacitances. If the output load capacitance is small enough, the terms E and F can be ignored. The feedback capacitors $C_F$ and $C_{F1}$ (shown in FIG. 22) should be substantially greater than the circuit's parasitic capacitance. The open loop gain indicates that the poles are on the left-half plane as long as the coefficients of the first-order and second-order terms of the denominator are positive. Consequently, circuit stability is maintained where relations (34) and (35), below, are valid.

$$R_F < \frac{4}{g_{m6}} \quad (34)$$

$$C_{F1} < C_F \quad (35)$$

These relationships are derived under the assumption that the terms E and F are negligible.

In order to verify the zero circuit effects, in the numerator of equation (30), it is assumed that $C_{gd3}$ is negligible. Equation (30) can be approximated by equation (36).

$$A(s) = -\frac{(-g_{m1} + sC_{gd1})(R_F C_F^2 s^2 + g_{m6} R_F C_F s + g_{m6})}{(C_F^2(4 - g_{m6} R_F) + B)s^2 + Cs + (g_{ds1} + g_{ds3})(g_{ds6} + g_{ds7})} \quad (36)$$

As shown in equation (36), the transfer response contains 3 zeros. One is located in the right-half plane at extremely high frequencies. The other two lie on the left-half plane and can be described as equation (37) below.

$$z_{1,2} = -\frac{g_{m6}}{2C_F} \pm \frac{\sqrt{g_{m6} R_F - 4}}{2C_F \sqrt{\dfrac{R_F}{g_{m6}}}} \quad (37)$$

It is clear from the above analysis that these two zeros are on the real frequency axis if $R_F > 4/g_{m6}$. Now, when it comes to the third order coefficient, D, the third pole moves to a lower frequency as $R_F$ increases. Larger values for $R_F$ generate wider bandwidth as the two more significant poles shift to higher frequencies as shown in equation (37). By selecting $R_F = 4/g_{m6}$, the circuit creates a double zero at frequency $-g_{m6}/2C_F$. In practice, there might still be a small imaginary part, but it has a negligible effect. Also, this analysis disregards parasitic capacitance and real circuits have these two zeros and the third pole appear at rather lower frequencies than the above analysis suggests. The dependence of the zeros on $C_F$ is much stronger than that of the two dominant poles. This gives more flexibility to the positioning of the zeros in a frequency compensation procedure when they can be moved without significantly altering the location of the two poles. Practically, the value of $R_F$ can be a little greater than $4/g_{m6}$ without the sacrifice of stability in simulation.

Figure 24A:
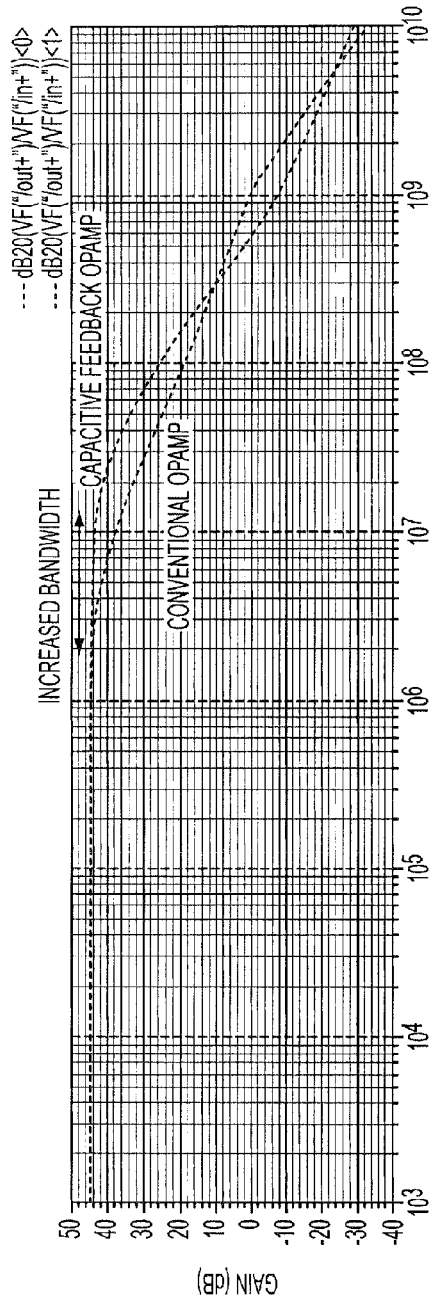
FIGS. 24A and 24B show gain and phase plots respectively, comparing the compensation technique of an embodiment of the present invention with a conventional RC compensation network for an operation amplifier.
Figure 24B:
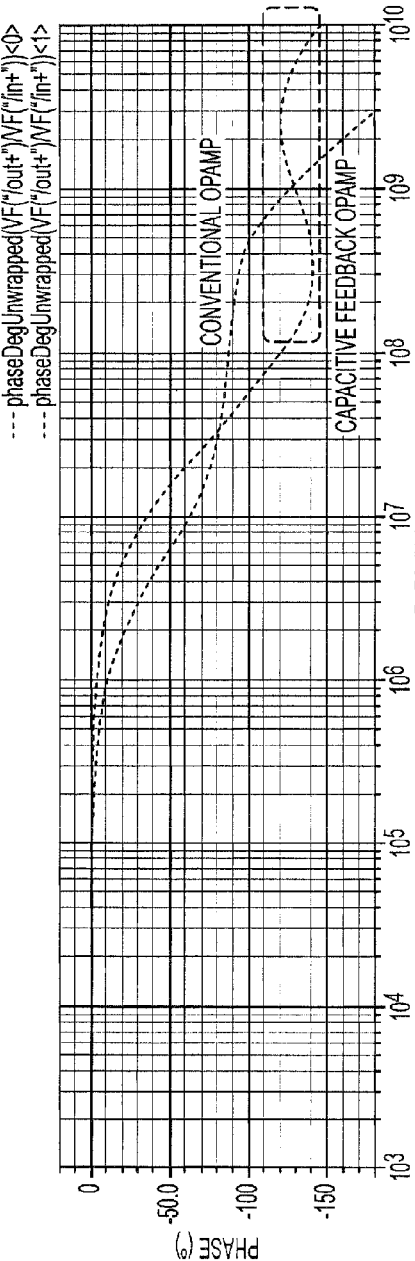

The double zero features found in the implementation can be very useful. It adds positively to the phase response, thus moving the −180° intersect to a much higher frequency. FIGS. 24A and 24B show the difference between the pole-splitting compensation method of a conventional RC approach and the compensation method of FIG. 22. The amplifier core used for this comparison is identical in both cases except for the circuit feedback elements. As shown in FIG. 24A, the subject circuit (referred to as capacitive feedback OPAMP) offers a 20 times increase in the frequency of the amplifier's dominant pole with respect to the classic RC approach for the same current dissipation. The increased flat response translates into increased bandwidth. The unity gain frequency is less important for the filter application. As shown in FIG. 24B, the phase response is non-monotonic, showing a minimum of −150° below the unity gain frequency, but this is not the relevant phase to consider for stability. The dotted box in the plot of FIG. 24B shows the increase of stability achieved through the subject circuit (capacitive feedback OPAMP).

The compensation technique can improve the amplifier's frequency behavior for the benefit of the filter performance. The filter's linearity is improved and so is the frequency response.

To achieve maximum flat response over several hundred MHz, the above described compensation technique uses the pole-zero and second feedback capacitance (the cross-coupled capacitors $C_{F1}$ of FIG. 22). Simulations revealed that using the amplifier with this compensation technique in the filter provides significant improvement in both in-band and out-of-band IIP3 performance compared to conventional approaches. More specifically, the performance gain increases as the two input tones move higher in frequency. In addition, the subject circuit may mitigate the filter's passband ripple.

Referring again to FIG. 22, the CMFB circuitry is shown. The common mode voltage, $V_{CM}$ is in the region of half the supply voltage (typically, 600 mV for a 1.2 V supply). The same current flows through $M_{32}$ and $M_{33}$ only if their gate voltage $V_G$ is equal. Where $V_{CM}$ remains constant, then, the half sum of the voltage at the two output stages must equalize $V_{CM}$ for a current equilibrium in $M_{32}$ and $M_{33}$. Hence, the loop that closes through $M_{32}$, $M_{33}$, $M_{34}$, $M_{35}$ and $M_{36}$ maintains the dc output voltage equal to $V_{CM}$. This loop has small gain in order to be wideband and stable. Capacitors $C_1$ and $C_2$ improve the loop phase margin so that common mode oscillations are not sustained. $C_1$ also enhances the bandwidth of the CMFB loop in order to provide sufficient common mode rejection ratio (CMRR) at high frequencies.

Table 2 summarizes the simulated performance of the subject operational amplifier.

TABLE 2

| Parameters | Performance |
| --- | --- |
| DC gain | 45 dB |
| Phase Margin | 45° |
| Gain Bandwidth | 600 MHz |
| Power Consumption | 3.1 mW |

A mixer's frequency converting action is characterized by conversion gain or loss. The voltage conversion gain is the ratio of the RMS voltages of the IF and RF signals. The power conversion gain is the ratio of the power delivered to the load and the available RF input power. When the mixer's input impedance and load impedance are equal to the source impedance, the power and voltage conversion gains, in decibels, are the same. When the circuit load is a mixer with a high impedance filter, this condition is not satisfied.

The mixer's conversion gain and output distortion level was simulated and the conversion gain calculated using equation (38) below.

$$\text{Conversion Gain} = 20 \cdot \log\left(\frac{\text{output voltage}}{\text{input voltage}}\right) \quad (38)$$

According to the simulation, for the main 1 MHz IF signal, the mixer achieved a conversion gain of 10.3 dB; and for a 10 MHz IF signal, the mixer produced 8.3 dB of conversion gain.

Figure 25:
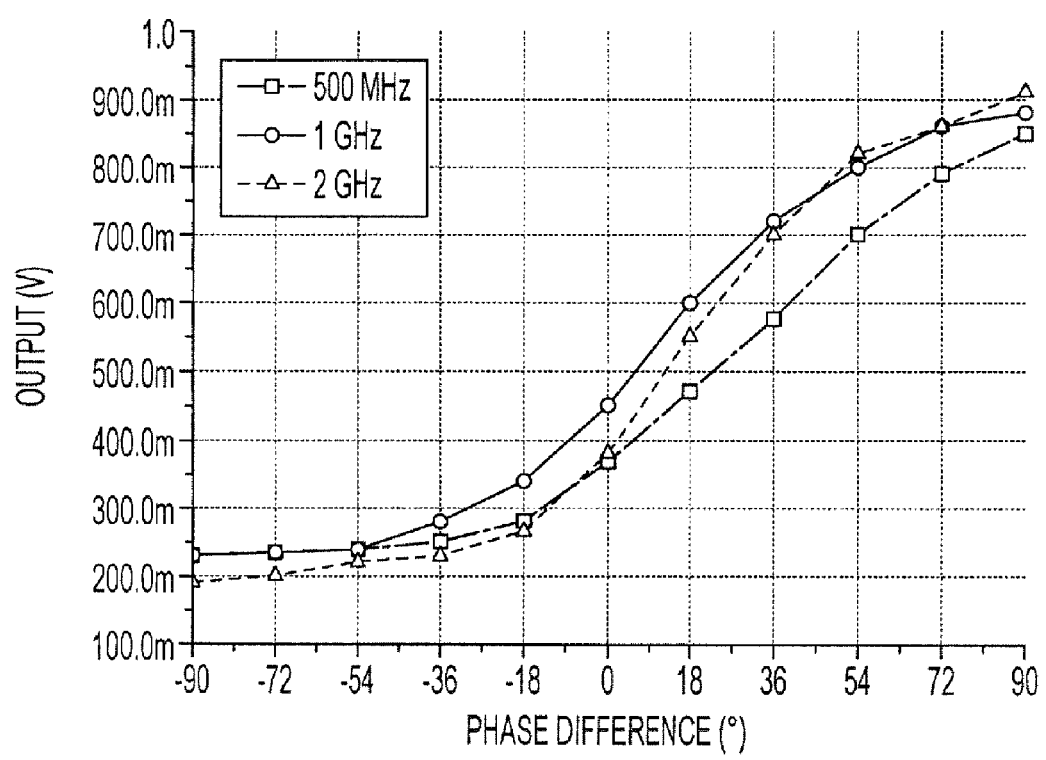
FIG. 25 shows a plot of the subject double balanced mixer output functioning as a phase detector over a range of frequencies.

As a phase detector, the mixer produces different dc voltages proportional to the difference from the input phase quadrature. FIG. 25 shows the mixer performance as a phase detector. As the phase difference increases, the output dc level increases. The response of the phase detector shows a conventional multiplier response. For a small phase difference, the output dc changes rapidly while the output dc changes slowly for a large phase difference (for example, a phase difference >36°). The simulation is performed for 500 MHz, 1 GHz, and 2 GHz. Depending on the operational frequency, the response shows slight differences. A phase detector circuit was fabricated in accordance with an embodiment of the present invention for performing tests. The measured conversion gain for different input frequencies varied less than 1 dB from 750 MHz to 2 GHz. In addition, an input 1 dB gain compression level was measured when the LO power level was 7 dBm.

Referring again to FIG. 8, the phase shifter can include an auto-adjustment to help reduce output amplitude error. The auto-adjustment 17 can include a comparator and phase shifter control unit.

In the system, the mixer can act as an ideal phase detector by forcing the input signals to be in quadrature. Considering the mixer in a standalone operation, any deviation error from quadrature results in an output amplitude error, which is very small when the deviation around quadrature is small. For example, a 1° offset from quadrature results in an amplitude error of −0.001 dB. However, the subject phase shifter delay-line discriminator affects the mixer's operation due to the presence of the delay line before the mixer. This problem is inherent in delay-line discriminators. A high phase shift can result when the delay time is much larger than the DUT signal period. In such a case, the deviation from a quadrature condition is amplified by the delay, which results in significantly larger dc offset and amplitude detection errors. Accordingly, an auto-adjustment or calibration circuit can be incorporated to help the input signal maintain quadrature.

Figure 26:
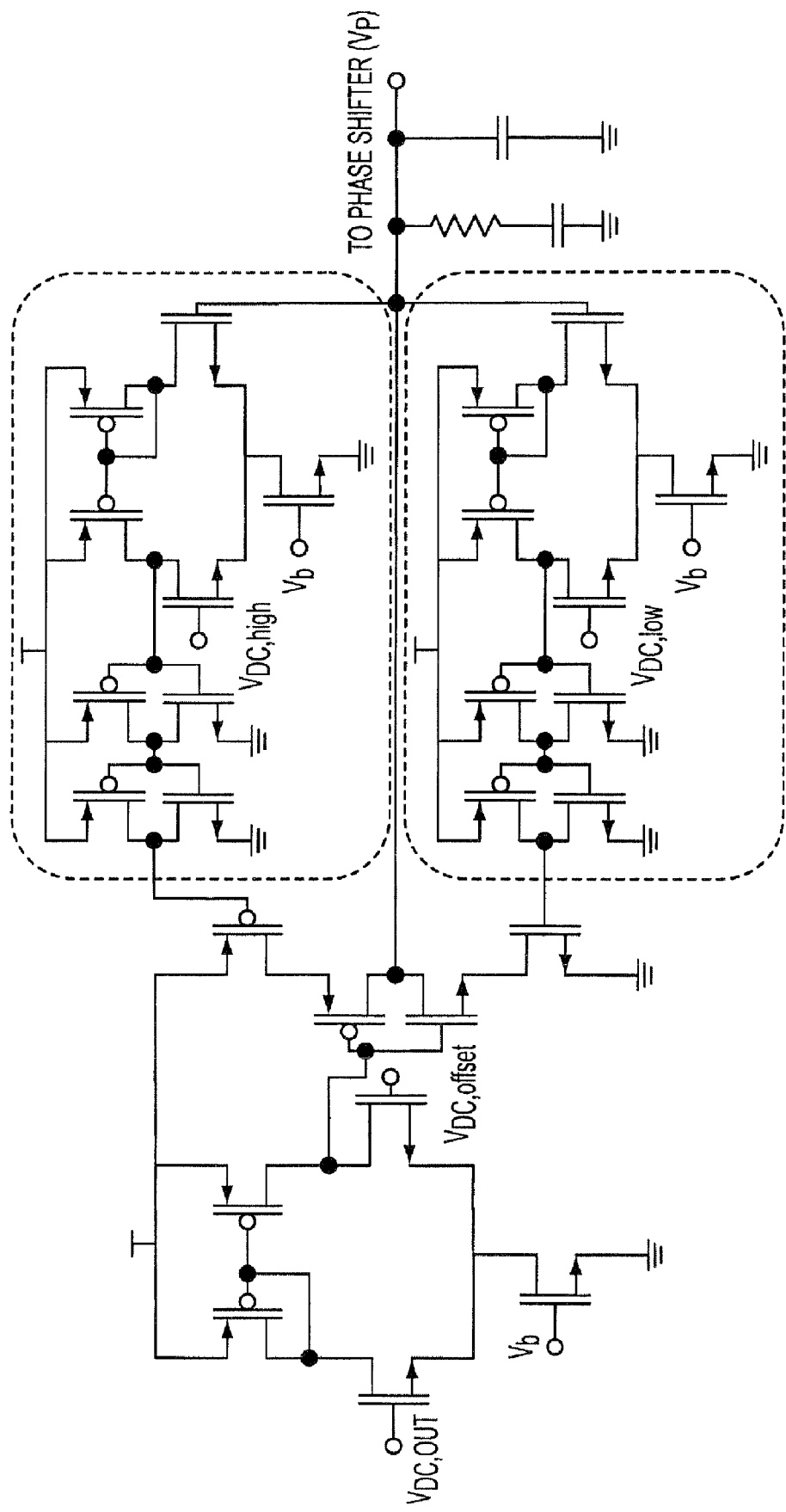
FIG. 26 shows a schematic of an auto-phase adjustment unit circuit in accordance with an embodiment of the present invention.

An auto adjustment unit can include a calibration circuit using a dc comparator, charge pump and reset switch. FIG. 26 shows a calibration circuit in accordance with an embodiment of the present invention. Referring to FIG. 26, the circuit includes a comparator (in the form of an operational amplifier) to measure the dc signal at the mixer output against a zero dc state (for example from $V_{ref}$ in FIG. 8). A charge pump is created by the low pass filter portion near the output to the phase shifter, and a reset switch is provided at the output of the operational amplifier and connected to a reset circuit (shown within the dotted boxes). The circuit can monitor the comparator output and then decide on the proper voltage step to drive the control voltage $V_p$ for the phase shifter (see FIGS. 16 and 17).

By comparing the mixer output with a zero dc state, the charge pump achieves the proper dc level. For example, charge accumulates as the inverter at the output of the operational amplifier switches on and off. The reset switch works for the case of excessive dc levels. If the charge pump accumulates a dc level more or less than the available control voltage (for example 0.45~0.75V), the reset switch turns on and resets dc level in order to avoid system malfunction. As shown in FIG. 26, a reset for overload upper limit of phase shifter (top dotted boxed section) and a reset for overload lower limit of phase shifter (lower dotted boxed section) are provided. According to a specific embodiment where the upper limit control voltage is 0.75V and the lower limit control voltage is 0.45V, the dc offset can be set to 0.54 V to help the input signal maintain quadrature. In accordance with an embodiment, the circuit for calibration only controls the dc voltage and does not interfere with bandwidth or frequency issues.

Returning yet again to FIG. 8, a balun (11, 12) is incorporated in the schematic to convert a single ended signal from a DUT 10 to a differential signal with a 180° phase difference. In addition, a balun 16 can be incorporated to convert a differential signal at the output to a single ended signal for use in the phase shifter control circuit and output readings. A number of baluns can be used in the subject discriminator circuit in order to supply signals for differential system components including the delay line and the phase shifter. The baluns can be active baluns in order to take advantage of their wide-band characteristics in a very small chip area.

Figure 27:
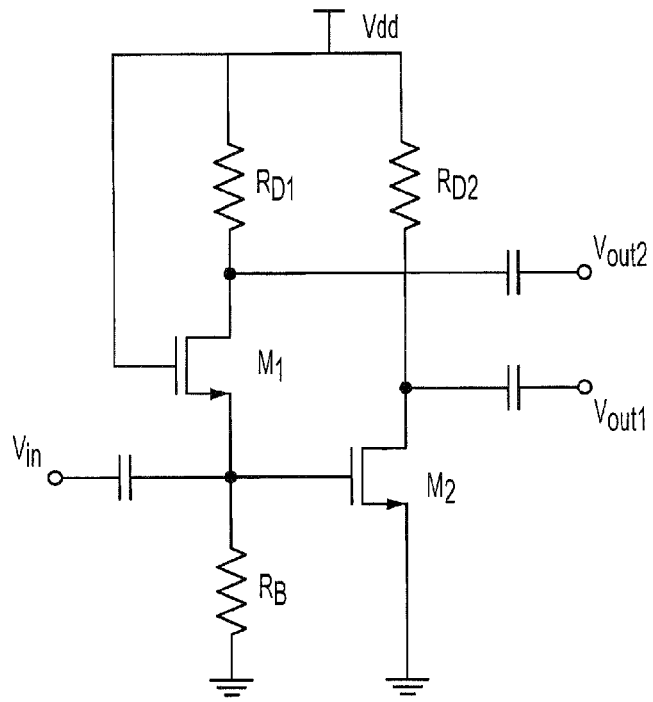
FIG. 27 shows a schematic of a cascaded common source-common gate balun in accordance with an embodiment of the present invention.

According to an embodiment of the present invention, an active balun having a common-source common-gate topology can be used for one or more of the baluns in the system. FIG. 27 shows a schematic of an active balun that can be used in accordance with an embodiment of the present invention. The circuit shown in FIG. 27 can achieve broadband input impedance matching through adjusting the input active device size. The input impedance at the gate of an active device in a common source topology is typically very high due to its large capacitive component. The input reflection coefficient of a common gate device can be described approximately by $1/g_m$. Therefore, the proper selection of device size and biasing can yield a 50 Ω input impedance. The input impedance of the common gate device is in parallel with the very high input impedance of the common source device so that the resulting input impedance is approximately that of the common gate device. Accordingly, an input matching circuit, which typically is implemented using passive devices such as transmission lines, inductors and capacitors, can be omitted. The input matching circuits may limit the balun bandwidth due to their Q or frequency selectivity. Accordingly, embodiments of the present invention that omit the input matching circuits can have improved bandwidth. In addition, matching or feedback compensation through on-chip inductors, which consume a very large area, can also be omitted.

The resistor $R_B$ is designed to have resistance large enough to result in a very small impact on the input impedance of the circuit because it is in parallel with $1/g_{m1}$. The gate of the first transistor $M_1$ can be biased at $V_{dd}$ to avoid additional biasing circuitry and the gate of the second transistor $M_2$ is biased at a voltage level set by the drop across $R_B$ which is determined by the dc current through the first transistor $M_1$. Also, the AC bypass capacitance at both input and output ports is designed to be large enough to enhance the low frequency performance by establishing a proper low frequency cut-off frequency.

In accordance with embodiments of the present invention, the circuitry for the subject system can be implemented in standard CMOS technology in order to minimize the test system overload on the DUT system.

Again, as illustrated in FIG. 8, the embedded system uses a differential circuitry by converting a single-ended signal into a differential signal through an active balun. The test signal is delayed through the analog delay line which minimizes the unwanted test signal distortion by introducing a level-shifting method to achieve 0 dB gain. The variable phase shifter also adapts the same method to minimize unwanted test signal distortion. The double-balanced mixer suppresses the signal components of the test signal and leaves the noise components, which contain the phase noise components. By monitoring the system output level, an auto-adjustment unit cancels out the signal component automatically.

Following are examples that illustrate procedures for practicing and understanding the invention. These examples should not be construed as limiting.

EXAMPLES

A phase noise measurement circuit was fabricated in a 0.13 μm, seven metal CMOS process (IBM8HP) as described in the 2009 Thesis by Jaeshin Kim entitled "Broadband Balun and Phase Noise Measurement System Design for RFIC Testing." The fabricated noise measurement circuit occupied an active area of 1 mm×15 mm. For the example test design, the active baluns are self-biased by using a biasing resistor at the input port. The active delay line uses three dc biases: VDCIN (≅0.4V) for the input dc level. VCDLY (0.5~1.2V) for the current source biasing of the active delay line to control the active delay line gain, and VBDLY (0.35~0.6 V) for the current source biasing of a source follower of the dc level shifter. Depending on the carrier frequency, the active delay line gain will vary. Thus, the current source biasing controls the active delay line gain. In addition, by controlling the source follower current, the fine tuning of an active delay line gain can be possible.

The phase shifter also uses biasing. VPVCDL (0.45~0.75V) controls the symmetric load impedance. In this example design, it is not necessary to control VPVCDL since the auto-adjustment unit provides the dc bias for the symmetric loading of the phase shifter. VCVCDL is for the current source biasing of the source follower for the dc level shifter. The magnitude of VCVCDL (≅0.5V) is similar to VBDLY in the active delay line.

The passive mixer also has a dc bias for its input signal. The passive mixer is designed to work in the triode region. So the input signal dc levels are set to operate the passive mixer in the triode region. VLODC (≅1V) is for dc biasing the internal gate inputs. The active RC filter has three dc biases, VAMP (≅0.6V) for the operational amplifier (OPAMP) input bias since the OPAMP input dc range does not cover the entire dc bias range, VCM (≅0.55V) for the OPAMP CMFB reference, and VCAMP (≅0.5V) for the output buffer bias. In this set-up, the CMFB of OPAMP uses a reference bias to compare it with the average of OPAMP output bias. Then, the CMFB adjusts the OPAMP output dc bias to operate correctly.

The first step in characterizing the example test phase noise measurement system is to validate the linear gain relation between the output voltage fluctuations and the DUT frequency deviation ($f_m$).

The sinusoidal modulating signal, can be described by equation (39).

$$m(t)=A_m \cdot \cos(2\pi f_m t) \quad (39)$$

The instantaneous frequency of the resulting FM signal is shown in equation (40) below.

$$f(t)=f_c+k_f A_m \cdot \cos(2\pi f_m t)=f_c+\Delta f \cos(2\pi f_m t) \quad (40)$$

The quantity Δf is the frequency deviation, representing the maximum departure of the instantaneous frequency of the FM signal from the carrier frequency $f_c$. A fundamental characteristic of an FM signal is that the frequency deviation, Δf is proportional to the amplitude of the modulating signal and is independent of the modulation frequency (FM rate). The phase of the FM signal is obtained as equation (41).

$$\theta_i(t) = 2\pi \int_0^t f_i(\tau) d\tau = 2\pi f_c t + \frac{\Delta f}{f_m} \cdot \sin(2\pi f_m t) \quad (41)$$

The ratio of the frequency deviation, Δf, to the modulation frequency, $f_m$, is commonly called the modulation index of the FM signal and is shown in equation (42).

$$\beta = \frac{\Delta f}{f_m} \quad (42)$$

Figure 28:
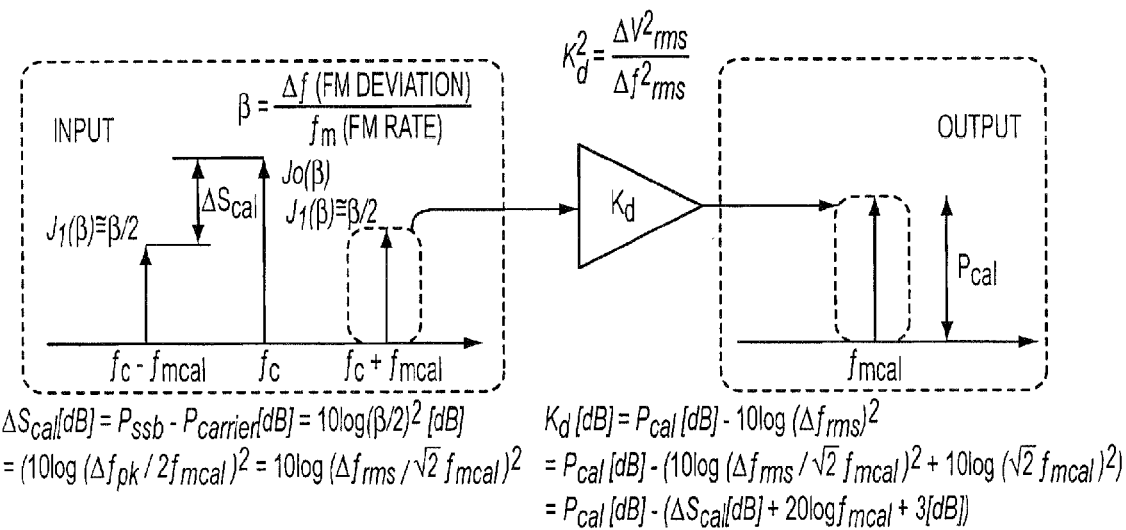
FIG. 28 shows a linearity test procedure and calibration method according to an embodiment of the present invention for the embedded phase noise measurement system.

FIG. 28 shows the relationship between the FM deviation and the FM rate. The FM deviation is proportional to the signal amplitude and the FM rate defines an offset frequency. The calibration constant is a different name for the system gain. The equations shown in FIG. 28 assume that the measurement resolution bandwidth is 1 Hz, for simplicity.

The input signal power is determined by the FM deviation for the case of a small modulation index (β<0.2). Thus, a linearity test is performed by checking the output power's dependence on the input signal variation, which is proportional to the FM deviation. The FM deviation represents the amplitude of the voltage of the input signal at a 50Ω system.

The input signal power can be easily determined by equation (43) as shown in FIG. 28.

$$\text{Input Power} \propto (\Delta f)^2 = (\beta \cdot f_m)^2 \quad (43)$$

Figure 29A:
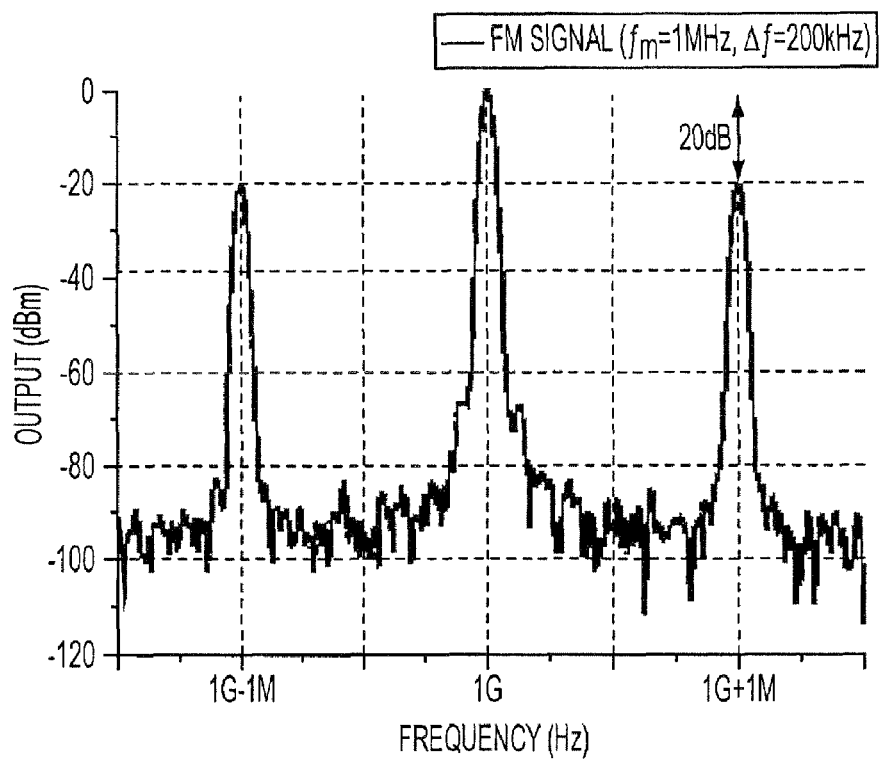
FIGS. 29A and 29B show plots of the linearity test for an input test signal (FM dev=200 kHz, FM rate=1 MHz) and the resultant output signal at 1 MHz, respectively.
Figure 29B:
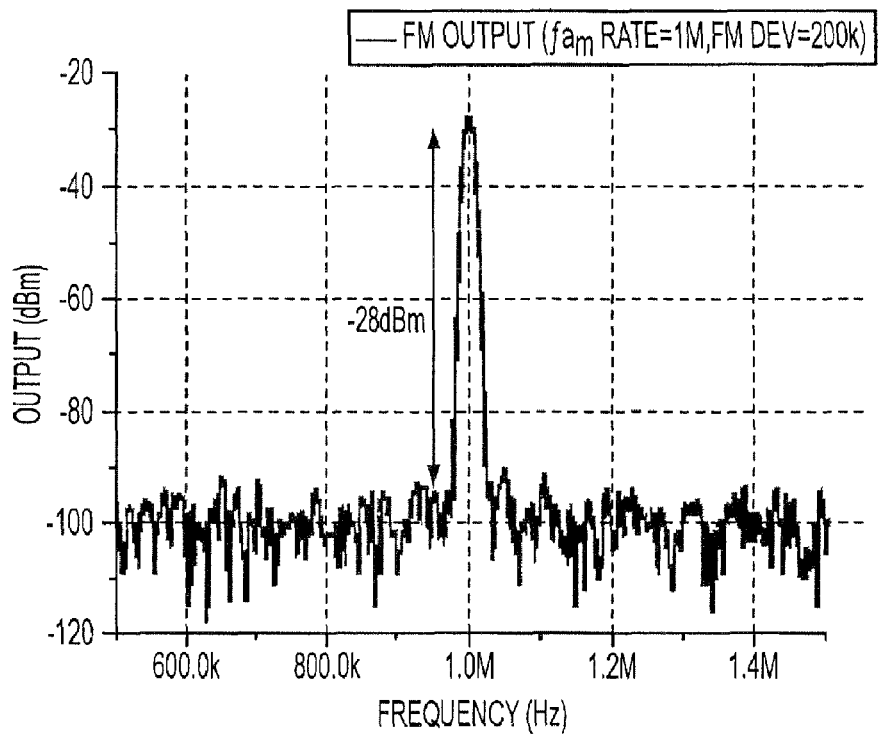

For example, FIGS. 29A and 29B show the linearity test and the calibration procedure for a 1 GHz 0-dBm carrier signal. FIG. 29A shows the input signal with 200 kHz FM deviation and 1 MHz FM rate. The modulation index is displayed in terms of signal power so the actual input signal power needs to be converted to a more familiar form. Here, the modulation index is 0.2 with 200 kHz frequency deviation. In case of a 100 kHz of FM rate, 0.2 of the modulation index requires a 20 kHz FM deviation. The input signal power appears similar for both cases. However the actual input power is determined by the FM deviation as shown in equation (44).

$$\text{Input Power}[dB] \propto \Delta f[dB] = 20\log(\beta) + 20\log(f_m) \quad (44)$$

The actual input power for 20 kHz FM deviation is −20 dB less than the one for 200 kHz FM deviation. As the FM deviation gets smaller at a fixed FM rate, the input power level decreases at a rate of −20 dB/Decade. The output signal power can be detected at the same FM rate (offset frequency) as shown in FIG. 29B. The input signal power can be estimated using equation (45) to equation (48).

$$(\Delta f_{rms})^2 = (\Delta f_{rms}/\sqrt{2} f_m)^2 \cdot (\sqrt{2} f_m)^2 \quad (45)$$

$$\frac{P_{ssb}}{P_{carrier}} = \left(\frac{\beta}{2}\right)^2 \quad (46)$$

$$= \left(\frac{\Delta f_{pk}}{2 f_m}\right)^2$$

$$= \left(\frac{\Delta f_{rms}}{\sqrt{2} f_m}\right)^2$$

$$\Delta S_{cal} = P_{ssb} - P_{carrier} \quad (47)$$

$$= 20\log\left(\frac{\beta}{2}\right)$$

$$= 20\log\left(\frac{\Delta f_{rms}}{\sqrt{2} f_m}\right)$$

$$(\Delta f_{rms})[dB] = 20\log(\Delta f_{rms}/\sqrt{2} f_m) + 20\log(\sqrt{2} f_m) \quad (48)$$

$$= \Delta S_{cal} + 20\log(f_m) + 3$$

Thus, the input power for a 200 kHz FM deviation at 1 MHz offset is 103 dB while the input power for a 20 kHz FM deviation at 1 MHz is 83 dB. The rough calculation of the system gain is −131 dBm (−28 dBm-103 dB) for the case shown in FIGS. 29A and 29B.

The linearity test is performed by varying the modulation index. The input power level has a linear relationship with respect to the modulation index, as explained in equation (43) above. As shown in FIG. 28, both the modulation index and the $f_m$ rate for the input signal are varied with the completion of an auto adjustment process and the discriminator output is displayed as shown in FIGS. 29A and 29B using an Agilent E4448A spectrum analyzer. In order to measure the low-level output signal, the spectrum analyzer's sensitivity is enhanced by three methods. The first enhancement is by narrowing down the resolution bandwidth (RBW) of the spectrum analyzer up to 1 Hz. The second is by turning off or minimizing the input attenuator of the spectrum analyzer. The input attenuator serves to increase the spectrum analyzer's dynamic range by attenuating the high power input carrier. The last enhancement is through turning on the analyzer's internal preamplifier to increase the weak signal output signal of interest. These techniques effectively lower the displayed average noise level up to around −165 dBm. Thus, the low-level signal is detected.

Figure 30:
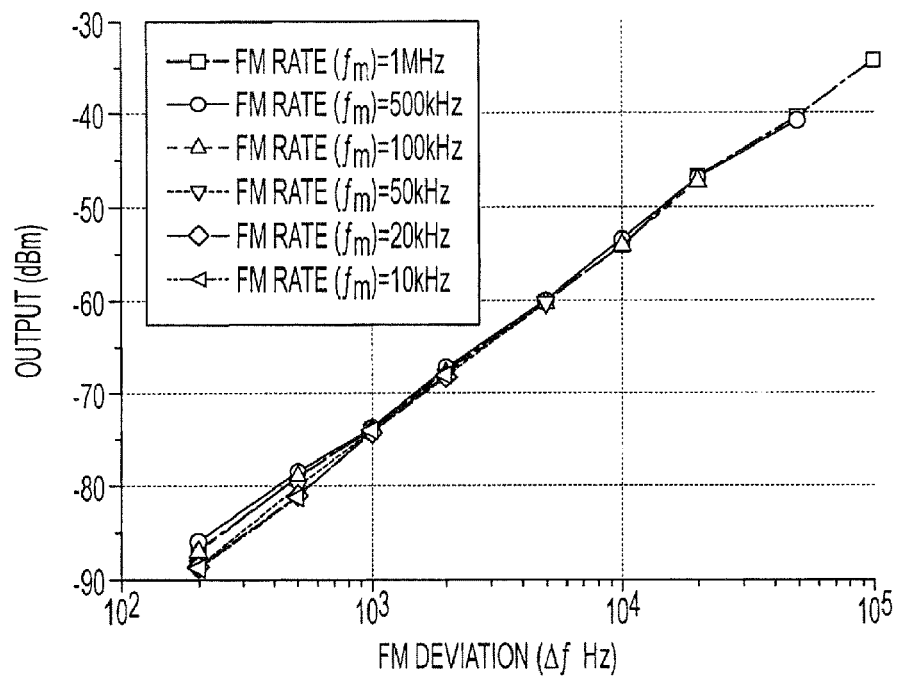
FIG. 30 shows a plot of linearity measurement as a function of FM deviation while the modulation index is less than 0.2 radians.

FIG. 30 shows the output power as a function of the FM deviation while the modulation index is less than 0.2 radians. Here, the FM deviation on the x-axis represents the input power dependence on the FM deviation. Thus, the x-axis presents the input power with a 20 dB/Decade increase. The displayed output shows good linearity up to a 1 MHz offset frequency because the output power shows a 20 dB/Decade increase while the input power level increases 20 dB/Decade as the FM deviation is proportional to input power level as shown in equation (44). The limitation of this measurement appears to stem from the signal generator used in the example tests, which can only generate a 1 MHz FM rate ($f_m$).

For a phase noise measurement, the calibration constant is evaluated for an accurate measurement. As shown in FIGS. 29A and 29B, the calibration constant derivation procedure is similar to a linearity test. The calibration constant can be calculated through equation (41) as explained in FIG. 28, and is provided below in equation (49). The calibration constants ($K_d$) will be the same as long as the system shows linearity.

$$K_d[dB] = P_{cal}[dB] - (\Delta S_{cal}[dB] + 20\log f_{mcal} + 3[dB]) \quad (49)$$

Table 3 shows the calibration constant extracted from the linearity test. Here $P_{cal}$, $\Delta S_{cal}$ and $f_{mcal}$ represent the output power, the power difference between the carrier and sideband of the input signal, and the measured offset frequency (measured FM rate), respectively. With a fixed FM rate, the FM deviation is changed to control the input signal level. As the input signal level gets smaller, the output power gets smaller at the same rate. Equations (50) and (51) show examples of this calculation.

$$K_d[dBm] = P_{cal}[dBm] - (\Delta S_{cal}[dB] + 20\log f_{mcal} + 3[dB]) \quad (50)$$

$$= -28[dBm] - (-20[dB] + 20\log 10^6 + 3[dB])$$

$$= -131[dBm]; f_{mcal} = 1\text{ MHz}, \Delta f = 200\text{ kHz}$$

$$K_d[dBm] = P_{cal}[dBm] - (\Delta S_{cal}[dB] + 20\log f_{mcal} + 3[dB]) \quad (51)$$

$$= -40[dBm] - (-32[dB] + 20\log 10^6 + 3[dB])$$

$$= -131[dBm]; f_{mcal} = 1\text{ MHz}, \Delta f = 50\text{ kHz}$$

TABLE 3

Calibration Constant Evaluation.

| | β | $\Delta S_{cal}$ [dB] | $P_{cal}$ [dBm] | $K_d$ [dBm] |
|---|---|---|---|---|
| fm rate = 1 MHz | 0.2 | −20 dB | −28 dBm | −131 |
| | 0.1 | −26 dB | −34 dBm | −131 |
| | 0.05 | −32 dB | −40 dBm | −131 |
| | 0.01 | −46 dB | −54 dBm | −131 |
| | 0.005 | −52 dB | −60 dBm | −131 |
| fm rate = 0.1 MHz | 0.2 | −20 dB | −48 dBm | −131 |
| | 0.1 | −26 dB | −54 dBm | −131 |
| | 0.05 | −32 dB | −60 dBm | −131 |

The calibration constant can be derived through the system gain as shown in equation (52).

$$V_{out,rms}^2(f_m) = (K_\phi 2\pi\tau_d)^2 \Delta f_{rms}^2(f_m) = K_d^2 \cdot \Delta f_{rms}^2(f_m) \quad (52)$$

The calibration constant is a function of the total system gain and the delay time ($\tau_d$) as shown in equation (52). Therefore, this calibration constant is calculated for each DUT in order to achieve accurate measurement results since the calibration constants will vary depending on the carrier power and the carrier frequency. This is because the fabricated system's gain has limitations in the input power and the operational frequency. The delay line and phase shifter are limited in input power since their peak-to-peak voltage amplitudes are limited to −3 dBm. Also, the delay line gain drops significantly over 1.5 GHz since the 100 cascaded stages of the delay cell reduces the operational frequency of the entire delay line. Also, the mixer shows input power limitations. With a signal input greater than 5 dBm, the output shows gain compression that limits the input linear power range of the system. The mixer gain varies depending on the carrier frequency. From 500 MHz to 2 GHz, the mixer gain variation is less than 2 dB. Thus, for up to a 1.5 GHz input signal with less than 0 dBm power, the calibration constant variation shows little variation (<5 dB).

The phase noise system dc output represents the DUT noise output having the phase noise information. This noise output is converted to a phase noise magnitude by using the measured calibration constant. The final phase noise can be obtained through equation (53).

$$L(f_m)[\text{dBc/Hz}] = S_v(f_m) - K_d - 20\log(f_m) - 3 - 10\log(B) \qquad (53)$$

where $S_v(f_m)$ is the output power, $K_d$ is the calibration constant and $B$ is the resolution bandwidth of the measured output power.

Figure 31A:
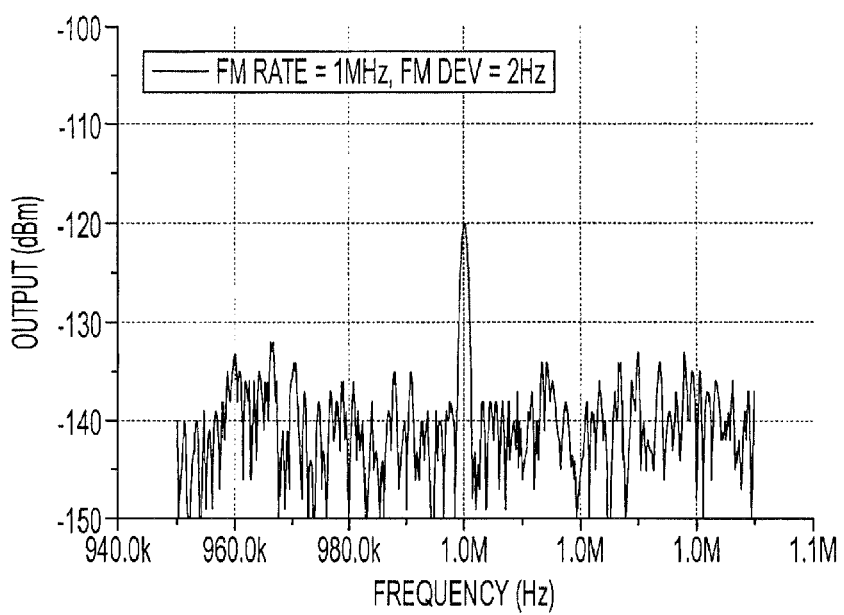
FIGS. 31A and 31B show sensitivity plots for a verification test circuit according to an example embodiment of the present invention.

The system sensitivity directly relates to the linearity measurement in terms of noise level since low power input is not detected at the output due to system generated noise. In this disclosure, the sensitivity defines the minimum detectable phase noise level without being affected by the system noise level. Thus, the sensitivity of the fabricated system is calculated based on a linearity measurement. The minimum detectable signal level is set by the noise floor level. The system sensitivity at a 1 MHz offset is derived in equation (54) and is based on the response in FIG. 31A.

$$\begin{aligned}L(f_m)[dBc/\text{Hz}] &= S_v(f_m) - K_d - 20\log(f_m) - 3 - 10\log(B) \qquad (54)\\ &= -140 - (-131) - 20\log(10^6) - 3 - 10\log(10^2)\\ &= -152 \ dBc/\text{Hz}\end{aligned}$$

Figure 31B:
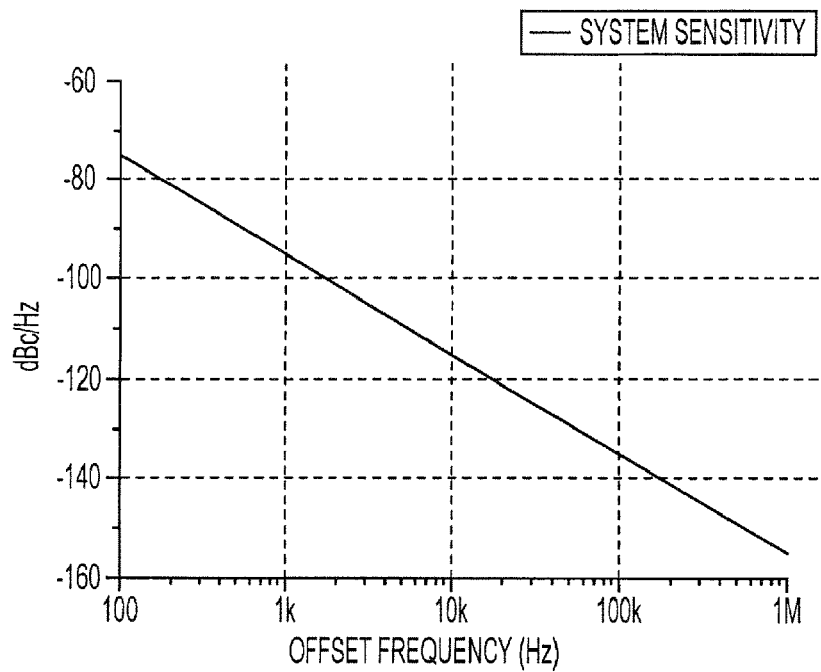

Equation (55) shows the system sensitivity at a 100 kHz offset. The minimum detectable signal level is almost same while measuring with the same resolution bandwidth with the offset ranging from 100 Hz to 1 MHz. Thus, the system sensitivity depends on the offset frequency so that, as shown in FIG. 31B, the system sensitivity shows a slope of 20 dB/Decade. FIG. 31B shows the system sensitivity as a function of offset frequency in log scale.

$$\begin{aligned}L(f_m)[dBc/\text{Hz}] &= S_v(f_m) - K_d - 20\log(f_m) - 3 - 10\log(B) \qquad (55)\\ &= -140 - (-131) - 20\log(10^5) - 3 - 10\log(10^2)\\ &= -132 \ dBc/\text{Hz}\end{aligned}$$

Figure 32:
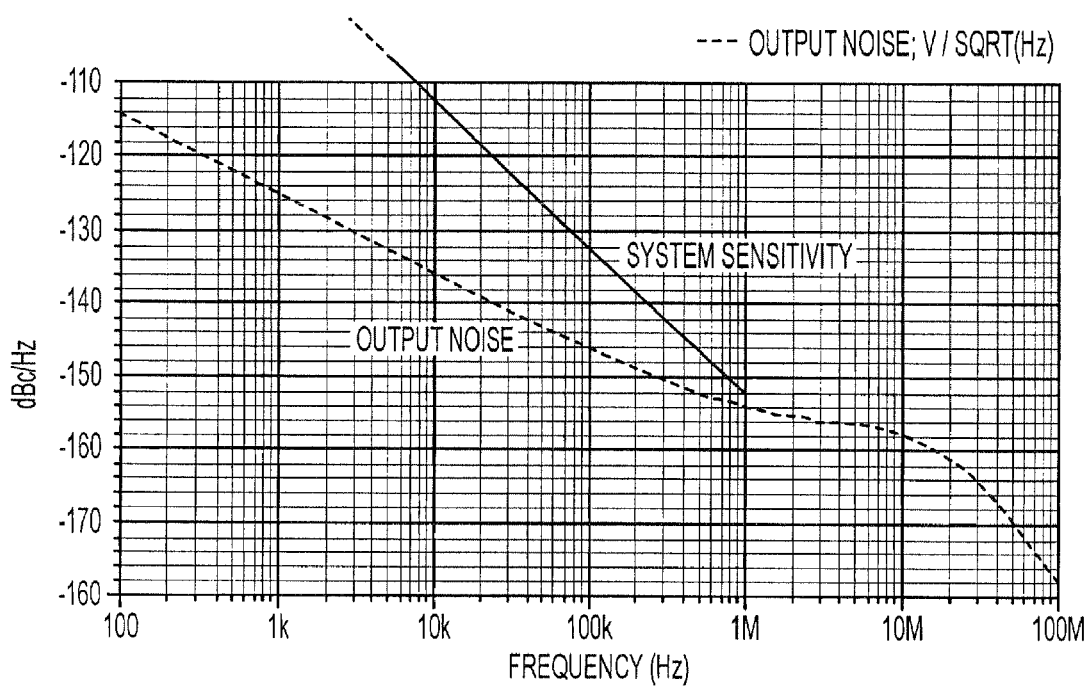
FIG. 32 shows a plot of system output noise and system sensitivity for the example system.

Ideally, the system can detect −152 dBc/Hz at 1 MHz offset frequency (where dBc is the power relative to the power of the main carrier frequency). This calculation did not consider any 1/f device noise since the system noise floor in simulation is less than the sensitivity level tip to 1 MHz as shown in FIG. 32.

The output noise shows 1/f noise slope of up to 1 MHz and over 10 MHz the system noise floor drops 20 dB/Decade since the active RC filter followed by mixer has around a 10 MHz operational bandwidth. The main noise source comes from the down-conversion mixer. In particular, the mixer is implemented by four NMOS devices and followed by an active RC filter (see FIG. 21). This active RC filter is the main contributor of the system noise floor. However, the noise analysis of this mixer shows less than −110 dB at 100 Hz offset. The mixer noise simulation shows a lower noise floor than the system sensitivity level up to 1 MHz. Therefore, the mixer device noise can be ignored in this case. However, other noise sources such as coupling noise and substrate noise can still impact the system.

In order to illustrate system performance, the test system was used to characterize a signal generator. The first measurement was performed with an Agilent L8254A signal generator. The measured results were compared to the Agilent F4448A spectrum analyzer phase noise measurement results. The signal generator specifications generally provide the noise floor information at a specific frequency so that the measured results can be compared the signal generator noise floor specifications. Also, the spectrum analyzer has a noise specification. This noise specification limits the accuracy of the spectrum analyzer measurement results.

Figure 33A:
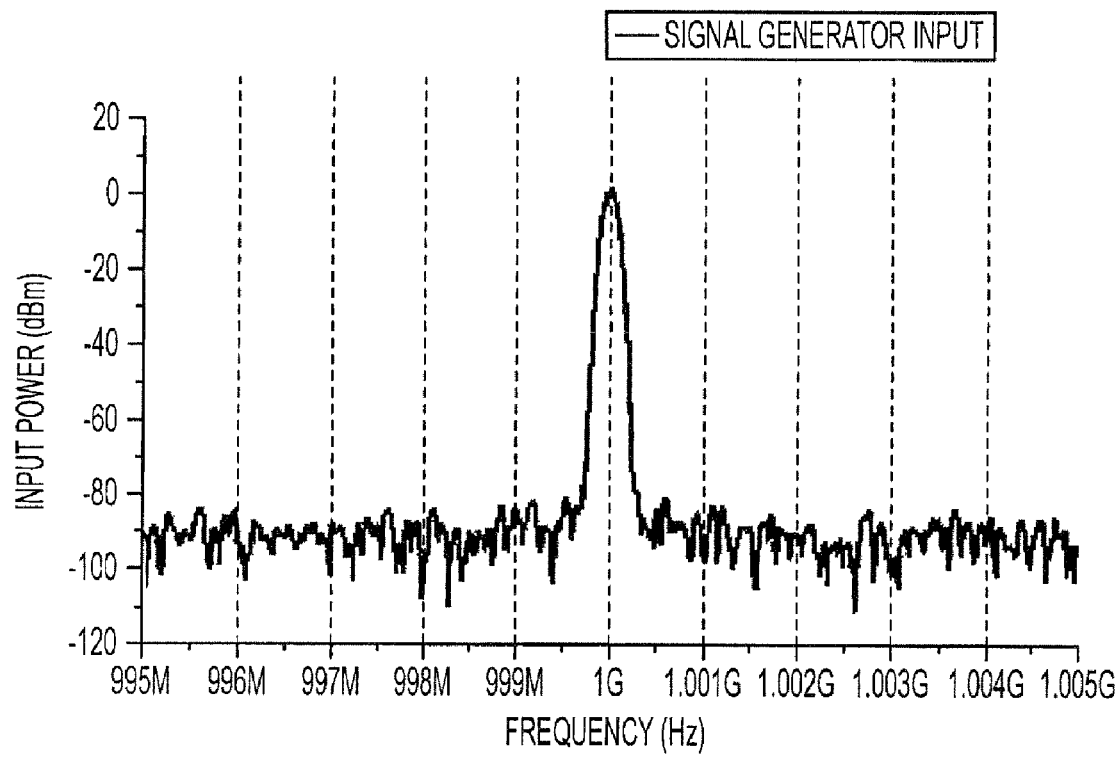
FIGS. 33A and 33B illustrate a phase noise measurement procedure.
Figure 33B:
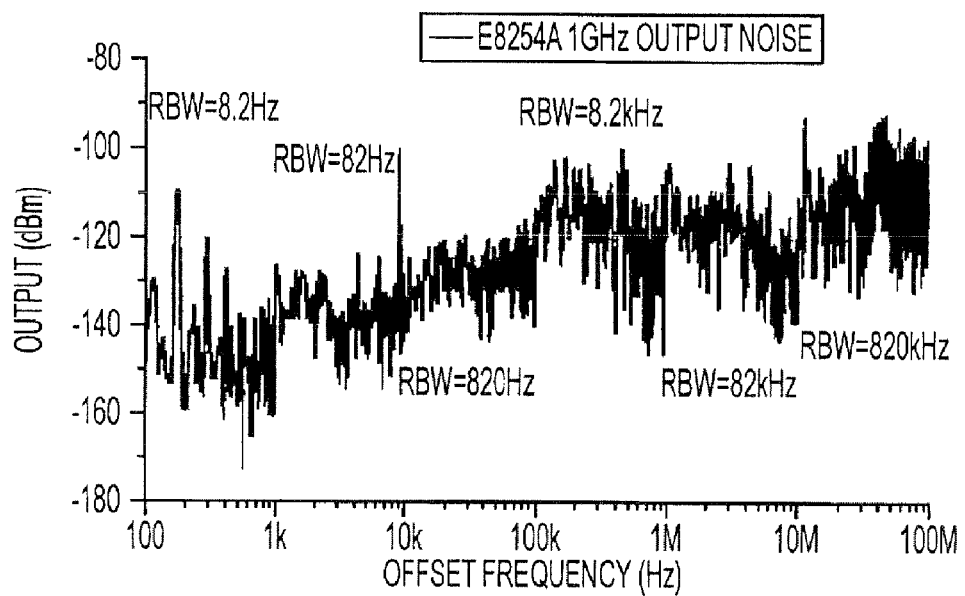

FIGS. 33A and 33B show the measurement procedure and actual output spectrum. The system output is measured by an input filter bandwidth depending on offset frequency. In this series of measurements, the measured resolution bandwidths (RBWs) of the spectrum analyzer are set to 1 kHz-10 kHz (RBW=82 Hz), 10 kHz-100 kHz (RBW=820 Hz), 100 kHz-1 MHz (RBW=8.2 kHz) and 1 MHz-10 MHz (RBW=82 kHz). The RBWs are set at the input stage of the spectrum analyzer. Since spectrum analyzers measure the RF signal power in a specific bandwidth, they can clearly be used to measure phase noise. Most modern analyzers include software functions which will convert a measured signal level from its absolute value to the equivalent noise signal in a 1 Hz bandwidth, then, a phase noise measurement can be derived.

Referring to FIG. 33B, the system output shows around a 10 dB difference per decade caused by the spectrum analyzer resolution bandwidth. A higher offset frequency requires 10 times bigger resolution bandwidth, or measurement time can be excessive.

The test system was also used to characterize other signal generators and a commercial VCO. The measured results for several DUTs demonstrate the possibility of on-chip phase noise evaluation ranging from 3 kHz to 2 MHz. Limitations of this system arise from the poor system sensitivity level for low offset frequencies and the operational bandwidth limitation of active RC filter for high offset frequency (>1 MHz). The gain roll-off at higher offset frequencies can be compensated since the gain drop ratio of OPAMP is known (−20 dB/Decade). As shown in FIGS. 35A and 35B, the system noise floor is lower than the system sensitivity. Thus, the mixer down-conversion noise and the noise generated by active delay line and phase shifter can be ignored up to 1 MHz where the sensitivity and the system noise floor intersect. In order to increase the system capability for phase noise evaluation, the whole system is optimized to lower the system noise level by designing each building block to minimize additive noise. In one optimization, the mixer is optimized to minimize the noise and the active RC filter is optimized in order not to generate excessive noise. The active RC filter can also be designed to have a wide operational bandwidth and to minimize its limiting effect to the range of the offset frequency.

The measurement results show an accurate phase noise performance ranging from 3 kHz to 1 MHz. The system sensitivity achieved −135 dBc/Hz at 100 kHz offset and −155 dBc/Hz at 1 MHz offset. The measurement limitations are mainly due to the system sensitivity at lower offset frequency and to gain roll-off at higher offset frequencies. For higher offset frequency response, the gain roll-off can be compensated through mathematical manipulation with the consideration of OPAMP gain roll-off in the signal path.

The proposed system measurements show the possibility of cost reduction by replacing expensive phase noise test equipment with a single chip having the subject circuitry thereon. In addition, the system sensitivity can be enhanced by increasing the double-balanced mixer gain or by increasing the signal delay time in the discriminator.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

All patents, patent applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art aid are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

We claim:

1. An embedded phase noise measurement system comprising:
   an analog delay line comprising a plurality of cascaded active amplifier stages;
   an analog phase shifter; and
   a mixer for comparing phase information of signals output from the analog delay line and the analog phase shifter and outputting a dc signal proportional to the phase difference between the signals output from the analog delay line signal and the signals output from the phase shifter,
   wherein the analog phase shifter comprises a plurality of cascaded variable delay cell stages, wherein each variable delay cell stage comprises:
   a variable resistance delay cell circuit; and
   a source follower circuit at an output of the variable resistance delay cell circuit.

2. The embedded phase noise measurement system according to claim 1, wherein each active amplifier stage comprises:
   a differential inverting amplifier; and
   a source follower circuit at an output of the differential inverting amplifier.

3. The embedded phase noise measurement system according to claim 1, wherein the plurality of cascaded active amplifier stages comprises 100 active amplifier stages.

4. The embedded phase noise measurement system according to claim 1, wherein the analog phase shifter is configured to achieve a 90 degree phase shift.

5. The embedded phase noise measurement system according to claim 1, wherein the plurality of cascaded variable delay cells comprises six variable delay cell stages.

6. The embedded phase noise measurement system according to claim 1, wherein the variable resistance delay cell circuit comprises:
   a differential inverting amplifier; and
   an active load element comprising a diode-connected first PMOS device in shunt with a second PMOS device, wherein the second PMOS device is biased using a load biasing circuit.

7. The embedded phase noise measurement system according to claim 6, wherein the load biasing circuit comprises:
   a replica-feedback bias circuit comprising a single-stage differential amplifier and a replica of half the variable resistance delay cell circuit, wherein an output of the single-stage differential amplifier supplies a signal to a gate of a NMOS current source in the replica of half the variable resistance delay cell circuit.

8. The embedded phase noise measurement system according to claim 7, wherein the single-stage differential amplifier comprises a self-biased PMOS source coupled pair, and wherein the load biasing circuit further comprises:
   an amplifier bias configured to have a flipped circuit topology, replacing NMOS with PMOS and PMOS with NMOS, with respect to the replica of half the variable resistance delay cell circuit and receive the output of the single-stage differential amplifier; and
   an initialization circuit configured to bias the single stage-differential amplifier at a power-up.

9. The embedded phase noise measurement system according to claim 6, further comprising an auto-adjustment circuit comprising a comparator and a phase shifter control unit for automatic control of phase quadrature for the analog phase shifter based on the output of the mixer, wherein the phase shifter control circuit supplies a signal to a gate of the second PMOS device.

10. An embedded phase noise measurement system comprising:
    an analog delay line comprising a plurality of cascaded active amplifier stages;
    an analog phase shifter; and
    a mixer for comparing phase information of signals output from the analog delay line and the analog phase shifter and outputting a dc signal proportional to the phase difference between the signals output from the analog delay line signal and the signals output from the phase shifter,
    wherein the mixer comprises:
    a double balanced mixer with an active RC filter; and
    a first capacitor shunt connected between a first output of the double balanced mixer and a first input of the active RC filter, and a second capacitor shunt connected between a second output of the double balanced mixer and a second input of the active RC filter, the first capacitor and the second capacitor being connected to a virtual ground.

11. The embedded phase noise measurement system according to claim 10, wherein the double balanced mixer is a Gilbert quad mixer.

12. An embedded phase noise measurement system comprising:
- an analog delay line comprising a plurality of cascaded active amplifier stages:
- an analog phase shifter; and
- a mixer for comparing phase information of signals output from the analog delay line and the analog phase shifter and outputting a dc signal proportional to the phase difference between the signals output from the analog delay line signal and the signals output from the phase shifter,
- wherein the mixer comprises a double balanced mixer with an active RC filter, wherein the RC filter comprises:
- an operational amplifier having a differential input stage, an output stage, and a common mode feedback circuit; and
- a compensation mechanism for expanding the operational amplifier's bandwidth.

13. The embedded phase noise measurement system according to claim 12, wherein the compensation mechanism comprises two compensation capacitors, one compensation capacitor cross-connected between an output of the differential input stage and an output of the output stage and the other compensation capacitor cross-connected between another output of the differential input stage and another output of the output stage.

14. An embedded phase noise measurement system comprising:
- an analog delay line comprising a plurality of cascaded active amplifier stages;
- an analog phase shifter;
- a mixer for comparing phase information of signals output from the analog delay line and the analog phase shifter and outputting a dc signal proportional to the phase difference between the signals output front the analog delay line signal and the signals output from the chase shifter; and
- an auto-adjustment circuit comprising a comparator and a phase shifter control unit for automatic control of phase quadrature for the analog phase shifter based on the output of the mixer.

15. The embedded phase noise measurement system according to claim 14, wherein the auto-adjustment circuit comprises:
- a voltage controlled inverting amplifier; and
- the comparator, wherein the comparator compares a dc output from the mixer with a reference voltage, wherein the output of the comparator provides a voltage for controlling the voltage controlled inverting amplifier.

16. The embedded phase noise measurement system according to claim 14, wherein the auto-adjustment circuit comprises:
- the comparator, wherein the comparator compares a dc output from the mixer with a reference voltage;
- an inverter at an output of the comparator;
- a charge pump connected in shunt to an output of the inverter; and
- a reset circuit, wherein the reset circuit is configured to turn on when the charge pump accumulates to a voltage higher than an upper limit for a control voltage for the analog phase shifter and when the charge pump accumulates to a voltage lower than a lower limit for the control voltage for the analog phase shifter.

17. The embedded phase noise measurement system according to claim 16, wherein the charge pump comprises a capacitor connected in shunt between the output of the inverter and the analog phase shifter.

* * * * *

UNITED STATES PATENT AND TRADEMARK OFFICE
CERTIFICATE OF CORRECTION

PATENT NO. : 7,952,408 B2
APPLICATION NO. : 12/492893
DATED : May 31, 2011
INVENTOR(S) : William Richard Eisenstadt and Jae Shin Kim It is certified that error appears in the above-identified patent and that said Letters Patent is hereby corrected as shown below:

Column 5,
Line 59, "arid directly" should read --and directly--.

Column 7,
Line 43, "phase kick" should read --phase lock--.

Column 11,
Line 49, "+ 20log$f_{meal}$ + 3[dB])" should read --+ 20 log$f_{meal}$ + 3[dB])--.

Column 19,
Line 34, the last line of equation (32) is missing, should read
--+ $C_F(C_{gd1} + C_{gd3} + C_{gd7} + C_{gs6} + C_{load})$--.
Line 38, "$(g_{ds1} + g_{ds3})$" should read --+ $(g_{ds1} + g_{ds3})$--.

Column 23,
Line 63, "level. VCDLY" should read --level, VCDLY--.

Column 24,
Line 29, "signal, can be" should read --signal can be--.
Line 35, "$f(t)=$" should read --$f_i(t)=$--.

Column 25,
Line 16, "However the actual" should read --However, the actual--.

Column 28,
Line 2, "level tip to 1 MHz" should read --level up to 1 MHz--.
Line 22, "F4448A" should read --E4448A--.

Signed and Sealed this
Sixth Day of September, 2011

David J. Kappos
*Director of the United States Patent and Trademark Office*

CERTIFICATE OF CORRECTION (continued)
U.S. Pat. No. 7,952,408 B2

Column 29,
Line 39, "art aid are" should read --art and are--.

Column 32,
Lines 3-4, "from the chase shifter" should read --from the phase shifter--.